(12) United States Patent
Milor et al.

(10) Patent No.: US 10,514,973 B2
(45) Date of Patent: Dec. 24, 2019

(54) MEMORY AND LOGIC LIFETIME SIMULATION SYSTEMS AND METHODS

(71) Applicant: Georgia Tech Research Corporation, Atlanta, GA (US)

(72) Inventors: Linda Milor, Atlanta, GA (US); Taizhi Liu, Atlanta, GA (US); Chang-Chih Chen, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 29 days.

(21) Appl. No.: 15/446,799

(22) Filed: Mar. 1, 2017

(65) Prior Publication Data

US 2017/0255732 A1 Sep. 7, 2017

Related U.S. Application Data

(60) Provisional application No. 62/301,652, filed on Mar. 1, 2016.

(51) Int. Cl.
*G06F 17/50* (2006.01)
*G06F 11/07* (2006.01)
*G11C 29/02* (2006.01)
*G11C 29/12* (2006.01)
*G11C 29/24* (2006.01)
(Continued)

(52) U.S. Cl.
CPC .......... *G06F 11/079* (2013.01); *G06F 11/008* (2013.01); *G06F 11/073* (2013.01); *G06F 17/5022* (2013.01); *G06F 17/5036* (2013.01); *G11C 29/02* (2013.01); *G11C 29/12005* (2013.01); *G11C 29/24* (2013.01); *G11C 29/50004* (2013.01); *G11C 29/50016* (2013.01); *G11C 29/70* (2013.01); *G11C 2029/1208* (2013.01); *G11C 2029/3602* (2013.01);
(Continued)

(58) Field of Classification Search
CPC ............. G06F 17/5036; G06F 2217/76; G06F 17/5081; G06F 17/5009; G06F 17/5022; G06F 11/008; G06F 2217/78; G06F 2217/80
USPC .................................. 716/106–108, 112, 136
See application file for complete search history.

(56) References Cited

U.S. PATENT DOCUMENTS 8,479,130 B1 * 7/2013 Zhang ................. G06F 17/5045
716/106
2003/0078741 A1 4/2003 Storino
(Continued)

OTHER PUBLICATIONS

Chen et al., Microprocessor Aging Analysis and Reliability Modeling Due to Back-End Wearout Mechanisms, Oct. 2015, IEEE, vol. 23, No. 10, pp. 2065-2076 (Year: 2015).*

(Continued)

*Primary Examiner* — Nghia M Doan
(74) *Attorney, Agent, or Firm* — Troutman Sanders LLP; Ryan A. Schneider; Brennan M. Carmody

(57) ABSTRACT

Aspects of the disclosed technology include a method including extracting, by a processor, a plurality of features from one from among a layout of a circuit, a netlist of the circuit, and the layout and the netlist of the circuit; computing, by the processor, respective lifetime distributions of the plurality of extracted features based on at least one circuit profile; and estimating, by the processor, a lifetime of the circuit by combining the respective lifetime distributions of the plurality of extracted features.

21 Claims, 22 Drawing Sheets

(51) Int. Cl.
    *G11C 29/50* (2006.01)
    *G11C 29/00* (2006.01)
    *G06F 11/00* (2006.01)
    *G11C 29/36* (2006.01)
(52) U.S. Cl.
    CPC .............. *G11C 2029/5002* (2013.01); *G11C 2029/5004* (2013.01); *G11C 2029/5006* (2013.01)

(56) References Cited

U.S. PATENT DOCUMENTS

| | | |
|---|---|---|
| 2009/0154242 A1 | 6/2009 | Janai |
| 2013/0124116 A1 | 5/2013 | Du et al. |
| 2014/0380106 A1 | 12/2014 | Presman et al. |
| 2016/0300004 A1* | 10/2016 | Barker ............... G06F 17/5036 |
| 2017/0160338 A1 | 6/2017 | Connor et al. |

OTHER PUBLICATIONS

G. Groeseneken, R. Degraeve, B. Kaczer, and K. Martens, "Trends and perspectives for electrical characterization and reliability assessment in advanced CMOS technologies." Proc. European Solid-State Device Research Conf, 2010, pp. 64-71.

E. Maricau, P. De Wit, and G. Gielan, "An analytical model for hot carrier degradation in nanoscale CMOS suitable for the simulation of degradation in analog IC applications." Microelectronics Reliability, vol. 48, No. .8, pp. 1576-1580, 2008.

A. Avellan and W.H. Krautschneider. "Impact of soft and hand breakdown on analog and digital circuits." IEEE Trans. Device and Materials Reliability, vol. 4, No. 4, pp. 676-680, 2004.

R. Fernandez, J. Martin-Martinez, R. Rodriguez, M. Nafria, and X.H.. Ayrnerich, Gate oxide wear-out and breakdown effects on the performance of analog and digital eircuits. lIEEE Trans. Electron Devices, vol. 55, No. 4, pp. 997.1004, 2008.

C.-C. Chen and L Milor, "Microprocessor aging analysis and reliability modeling due to back-end wearout mechansism," IEEE Trans. VLSI, 2015.

C.-C. Chen and L. Milor, "System-level modeling and microprocessor reliability analysis for backend wearout mechanisms," Proc. Design Automation and Test in Europe, 2013, pp. 1615-1620.

C.-C_ Chen and L Milor, "System-level modeling and reliability analysis of microprocessor systems," Proc. IEEE Int. Workshop otr Advances in Sensors and Interfaces. 2013, pp. 178-183.

E.Y. Wu and R.P. Vollertsen, "On the Weibull shape factor of intrinsic breakdown of dielectric films and its accurate experimental determination—Part I: Theory, methodology, and experimental techniques," IEEE Trans. Electron Devices, vol. 49, No. 12, pp. 2131¬2140, Dec. 2002.

X. Li, J. Qin, and J.B. Bernstein, "Compact modeling of MOSFET wearout mechanisms for circuit-reliability simulation." IEEE Trans. Device and Material Reliability, vol. 3, No. I, pp. 98-121, 2008.

M. Choudhury, V. Chandra. K. Mohanram. and R. Aitken., "Analytical model for TDDB-based performance degradation in combinational logic." Proc. Design. Automation & Test in Europe. 2010, pp. 423-428.

S.Y. Kim, G. Panagopoulos, C.-Hs. Ho. M. Katoozi, E. Cannon, and K. Roy. "A Compact SPICE Model for Statistical Post-Breakdown Gate Current Increase Due to TDDB." Proc. Int. Reliability Physics Symp., 2013.

C.-C. Chen, F. Ahmed, L Milor, Impact of NBTI/PBTI on SRAMs within microprocessor systems: modeling, simulation, and analysis, Microelectron. Reliab. 53 (2013) 1183-1188.

C.-C. Chen, S. Cha, T. Liu, L. Milor, System-level modeling of microprocessor reliability degradation due to BTI and HCI, IEEE IRPS2014. CA.8.1-CA.8.9.

S. Cha, C.-C Chen, T. Liu, L Milor, Extraction of threshold voltage degradation model¬ing due to negative bias temperature instability in circuits with I/O measurements, IEEE VLSI Test Symposium 2014, pp. 1-6.

C.-C. Chen, M. Bashir, L. Milor, D.H. Kim, S.K. Lim, Backend dielectric chip reliability simulator for complex interconnect geometries, IEEE IRPS2012. BD.4.1-BD.4.8.

G.S. Haase, et al., Modeling of interconnect dielectric lifetime under stress conditions and new extrapolation methodologies for time-dependent dielectric breakdown, Proc. IRPS 2007, pp. 390-398.

C.-C. Chen, M. Bashir, L. Milor, D.H. Kim, S.K. Lim, Simulation of system backend dielectric reliability, Microelectron. J. 45 (10) (2014) 1327-1334.

M. Bashir, C.-C. Chen, L. Milor, D.H. Kim, S.K. Lim, Backend dielectric reliability full chip simulator, IEEE Trans. Very Large Scale Integr. VLSI Syst. 22 (8) (Aug. 2014) 1750-1762.

K. Okada, K.Yamaoka, and H. Onodera, "A statistical gate delay model for intra-chip and inter-chip variabilities," in Proc. ASPDAC, 2003.

L. Brusamarello, G. I. Wirth, P. Roussel and M. Miranda, "Fast and accurate statistical characterization of standard cell libraries," Microelectronics Reliability, vol. 51, No. 12, pp. 2341-2350, Dec. 2011.

S. Gupta and S. S. Sapatnekar, "Compact current source models for timing analysis under temperature and body bias variations," IEEE Trans. VLSI Systems, vol. 20, No. 11, pp. 2104-2117, Nov. 2012.

B. Amelifard, S. 1-Iatami, H. Fatemi, and M. Pedram, "A current source model for CMOS logic cells considering multiple input switching and stack effect," in Proc. DATE, 2008, pp. 568-574.

B. Liu and A. B. Kahng, "Statistical gate level simulation via voltage controlled current source models," in Proc. IEEE Int. Workshop Behavioral Modeling Simulation, Sep. 2006, pp. 23¬27.

T. Liu, S. Aftabjahani and L. Milor, "Compact variation-aware models for standard cells with interconnect-dominated loads for statistical static timing analysis," in Proc. Design of Circuits and Integrated Systems, 2013.

* cited by examiner

MEMORY AND LOGIC LIFETIME SIMULATION SYSTEMS AND METHODS

PRIORITY CLAIM

This application claims benefit under 35 U.S.C. § 119(e) of U.S. Provisional Patent Application No. 62/301,652, filed Mar. 1, 2016 and entitled "Semiconductor Memory Systems and Methods," which is incorporated herein by reference in its entirety.

STATEMENT AS TO RIGHTS UNDER FEDERALLY SPONSORED RESEARCH

The disclosed subject matter was made with government support under NSF grant No. 1116786 awarded by the National Science Foundation and DARPA grant No. HR0011-11-1-0011 awarded by the Department of Defense. The government has certain rights in the invention.

TECHNICAL FIELD

The present disclosure is related to semiconductor simulation and, more particularly, to providing systems and methods for lifetime simulation of memory and logic.

BACKGROUND

The reliability of circuits has become an increasing concern with technology scaling due to the rapid advances in technology, where devices are being developed using new materials and processes. Time to market concerns make it difficult to fully understand the lifetime of circuits developed using these new materials and processes. As a result, electronic devices are increasingly vulnerable to reliability problems, meaning that components fail sooner than expected. These reliability problems are exacerbated by several factors, including technology scaling, higher operating temperatures, smaller device dimensions, and more powerful electric fields. In some cases, system failure rates in the field have increased by 365% when scaling from 180 nm to 65 nm, and the field failure rate continues to increase.

It is not uncommon for development of each new chip product to cost tens or hundreds of millions of dollars, including tens of millions of dollars for new designs. Related art approaches for determining reliability check if a circuit has adequate lifetime by operating samples of circuits at high voltage and high temperature to accelerate failure, called high-temperature operating life (HTOL) tests. Models are used to relate the failure rate of HTOL tests to the failure rate at use conditions. Correcting defects found during HTOL tests is potentially very expensive, costing millions of dollars to fix any failing design. Building a new mask set for a circuit, for example, costs millions of dollars for advanced technology nodes with design changes creating additional mask costs. Further, the time-to-market is increased when too many chips fail the HTOL test because of design release delays, causing millions of dollars in potential revenue losses.

FIG. 1 illustrates the design process in the related art. As can be seen, the design process includes developing 105 device technology and/or models. The device technology may include a manufacturing process of a completed design. The device models may include models of various hardware components implemented using the technology. In some cases, the device technology and models may be predefined and not readily adjustable. Next, the design process includes designing 110 a circuit based on the device technology and models. Once the circuit is designed 110, samples of the circuit are manufactured 115. After manufacturing 115, functional testing is performed 120, and reliability testing is performed 125. If the samples pass both tests 120 and 125, the design is produced 130 for delivery and distribution. If the device fails either the functional or reliability testing 120 and 125, the failure is analyzed 135 to pinpoint the fault. Then the circuit must be redesigned 110, remanufactured 115, and retested 120 and 125. In some cases, the device technology and/or models must be redeveloped 105 before redesigning 110 the circuit. In some cases, the reliability testing 125 may take several months or more. In the related art, a manufactured design fails the reliability testing up to 5% of the time. The redesign costs from a design failing the reliability testing 125 can be significant, and the delay to market may cost millions more.

In the related art, reliability models for circuit simulation enable simulation of transistors by incorporating certain wearout features in device modules. The related art simulation capacity is limited to estimating wearout due to bias temperature instability (BTI) and hot carrier injection (HCI). However, such related art estimation fails to consider reliability of memory, such as cache memory, associated with different configurations (e.g., associativity, cache line size, cache size, and replacement algorithm used), the effect of error correcting codes (ECCs), real temperature and ohmic potential drop (IR drop) profiles of a microprocessor, and the combined effect of BTI and HCI.

In addition, the related systems fail to consider soft-breakdown due to gate oxide breakdown (GTDDB), back-end dielectric breakdown (BTDDB), and middle-of-line time-dependent dielectric breakdown (MTDDB), and hard breakdown. In addition, the related art systems enable degradation estimation of small circuit blocks, but do not incorporate these models into cell libraries. Thus, related art systems are not able to accurately evaluate the impact of degradation on system performance or estimate system lifetime.

Accordingly, there is a need for accurate simulation of expected lifetimes of memory and logic, as well as an entire circuit.

SUMMARY

Briefly described, and according to one embodiment, aspects of the present disclosure generally relate to a method of simulating semiconductor lifetime. According to some embodiments, there is provided a method including: extracting, by a processor, a plurality of features from a layout of a circuit; computing, by the processor, respective lifetime distributions of the plurality of extracted features based on at least one circuit profile; and estimating, by the processor, a lifetime of the circuit by combining the respective lifetime distributions of the plurality of extracted features.

The least one circuit profile may include one or more from among a thermal profile, an activity profile, a state profile, a voltage source profile, and an ohmic potential drop (IR drop) profile.

The method may further include: counting, by the processor, a number of the plurality of features in the circuit layout; and identifying, by the processor, a location of the plurality of features.

The estimating may be based, at least in part, on the number and location of the plurality of features.

The circuit may include memory, and the computing respective lifetime distributions of the plurality of extracted features may vary, at least in part, as a function of at least one from among cache associatively, cache line size, cache size, and cache replacement algorithm.

The method may further include modeling, by the processor, at least one block of the circuit using multivariate adaptive regression splines (MARS) as a fitted function between response process parameters, environmental parameters, and timing parameters.

The computing the respective lifetime distributions may be based, at least in part, on the modeled at least one circuit block.

The estimating the lifetime of the circuit may include estimating the effect of error correction on the circuit.

The method may further include: generating, based on the activity profile, the stress profile, and the thermal profile, respective bias temperature instability (BTI) profiles of the plurality of devices/features; and generating, based on the activity profile and the stress profile, and the thermal profile, respective hot carrier injection (HCI) profiles of the plurality of devices/features, The computing of the respective lifetime distributions may be based, at least in part, on the combined effect of the BTI profiles and the HCI profiles.

The method may further include calculating, by the processor using statistical simulation, a time to failure distribution of a memory cell of the circuit based on at least one from among the thermal profile, the activity profile, the state profile, the voltage source profile, the IR drop profile, and process parameters.

The method may further include building, by the processor, a gate-delay model using multivariate adaptive regression splines (MARS) as a fitted function between response variables and process-voltage-temperature (PVT) variations across the circuit.

The computing the respective lifetime distributions may be based, at least in part, on the gate-delay model.

The time to failure distribution of the memory may be calculated for a plurality of discrete values within the thermal profile, the activity profile, the state profile, the voltage source profile, the IR drop profile, and the process parameters.

The method may further include modeling, by the processor, gates and interconnects of the circuit using MARS and a variational Pi-model load.

The computing of the respective lifetime distributions may be further based, at least in part, on the gate and interconnect models.

The gate delay model may further use MARS as a fitted function between response variables and the PVT variations across the circuit manufacturing process.

The method may further include: extracting, by the processor using block-based statistical timing analysis (StTA), critical paths; and generating, by the processor based on the critical paths, a circuit-delay distribution.

The estimating may be based, at least in part, on the circuit-delay distribution.

The estimating the lifetime of the circuit may be based on a combination of the circuit-delay distribution with a timing requirement of the circuit.

According to some embodiments, there is provided a method including: simulating, by a processor, a plurality of accelerated aging tests of a circuit over respective ranges of a plurality of parameters; determining, by the processor, a wearout mechanism of the circuit for each accelerated aging test; and identifying, by the processor, a selectivity region defined by sub-ranges of the plurality of parameters for which a specific wearout mechanism of the plurality of wearout mechanisms is most likely to occur.

The method may further include: selecting testing parameters for an accelerated aging test from within the selectivity region; and performing the accelerated aging test on a physical circuit.

The plurality of parameters may include temperature and operating voltage, and the specific wearout mechanism includes one from among gate oxide breakdown (GTDDB), backend dielectric breakdown (BTDDB), and middle-of-line time-dependent dielectric breakdown (MTDDB).

According to some embodiments, there is provided a method including: receiving, by a processor, a netlist of a circuit; identifying, by the processor and based on the received netlist, a plurality of features of the circuit that are vulnerable to a plurality of wearout mechanisms; computing, by the processor, respective lifetime distributions of the plurality of extracted features based on at least one circuit profile, the respective lifetime distributions being based, at least in part, on a combined effect of the plurality of wearout mechanisms; and estimating, by the processor, a lifetime of the circuit by combining the respective lifetime distributions of the plurality of extracted features.

The computing of the respective lifetime distributions may include: simulating, by the processor, a plurality of accelerated tests on the circuit; and identifying, by the processor, respective failures of the plurality of simulated accelerated tests.

According to some embodiments, there is provided a method including: receiving, by a processor, a netlist of a circuit; generating, by the processor and based on at least one first circuit profile, a bias temperature instability (BTI) profile of the circuit; generating, by the processor and based on at least one second circuit profile, a hot carrier injection (HCI) profile of the circuit; simulating, by the processor, a plurality of tests on the circuit, the simulating being based, at least in part, on a combined effect of the BTI profiles and the HCI profiles; and estimating, by the processor, a lifetime of the circuit, based on the simulated plurality of tests.

The simulating may include simulating, by the processor, the plurality of tests through the circuit failing to satisfy a defined performance metric, and the defined performance metric may include at least one from among a write margin, read and retention static noise margins (SNMs), a write margin, a read current, a minimum retention voltage, and circuit delay.

BRIEF DESCRIPTION OF THE FIGURES

The accompanying drawings illustrate one or more embodiments and/or aspects of the disclosure and, together with the written description, serve to explain the principles of the disclosure. Wherever possible, the same reference numbers are used throughout the drawings to refer to the same or like elements of an embodiment, and wherein.

DETAILED DESCRIPTION

Figure 1:
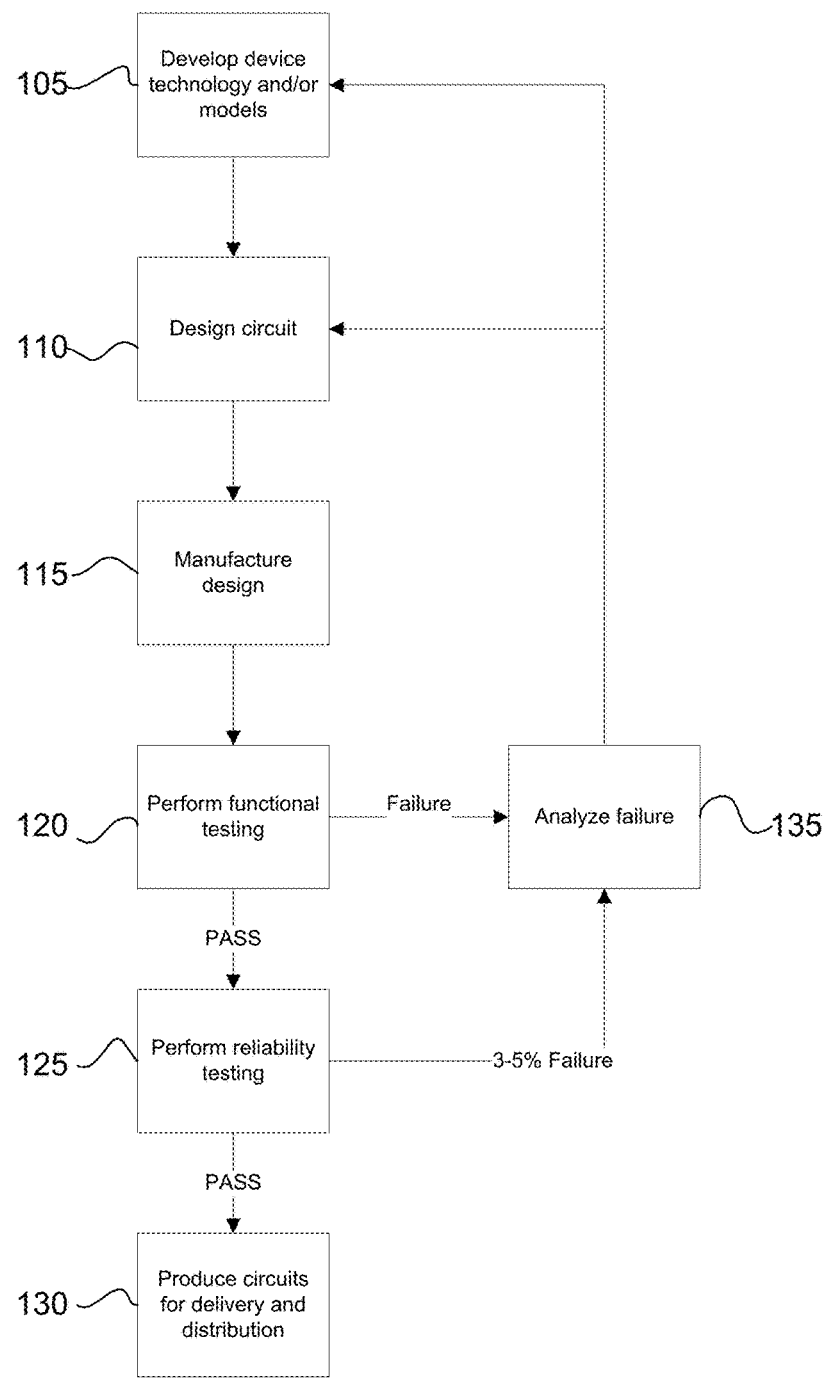
FIG. 1 is a flow chart of circuit design and production in the related art.
Figure 2:
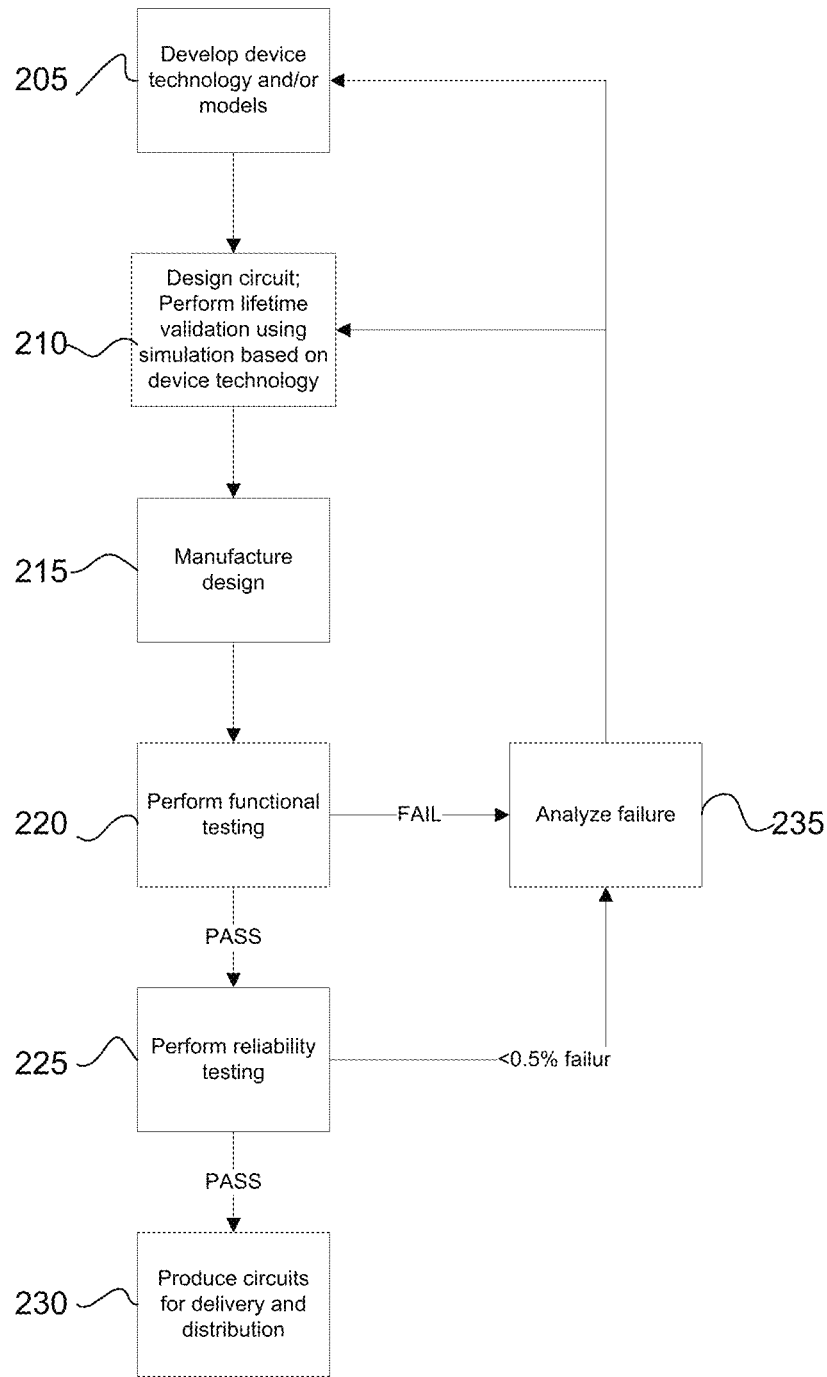
FIG. 2 is a flow chart of circuit design and production according to an example embodiment.

According to some implementations of the disclosed technology, a system includes reliability simulation tools. For example, FIG. 2 illustrates a circuit design process according to an example embodiment. As can be seen in FIG. 2, the design process includes developing 205 device technology and models; designing 210 a circuit and performing 210 lifetime simulation on the circuit; manufacturing 215 samples; performing 210 functional testing; performing 225 reliability testing; producing 230 the design; and analyzing 235 faults. Many of the blocks of FIG. 2 are analogous to blocks described above with reference to FIG. 1, and detailed descriptions of those elements are not repeated for compactness. As can be seen, the designing and verifying 210 further includes performing 210 lifetime validation via simulation models of the technology. In some cases, the performing 210 lifetime validation may reduce failures observed during reliability testing 225 by a factor of 10 or more, reducing the need for failure analysis 235, redevelopment 205, and redesign 210. Once the design passes reliability testing 225, circuits may be produced for delivery and distribution 230. In some cases, performing 210 lifetime validation may identify the most vulnerable blocks and most likely wearout mechanisms for a design so that the design can be improved upon prior to manufacturing 215.

Figure 3A:
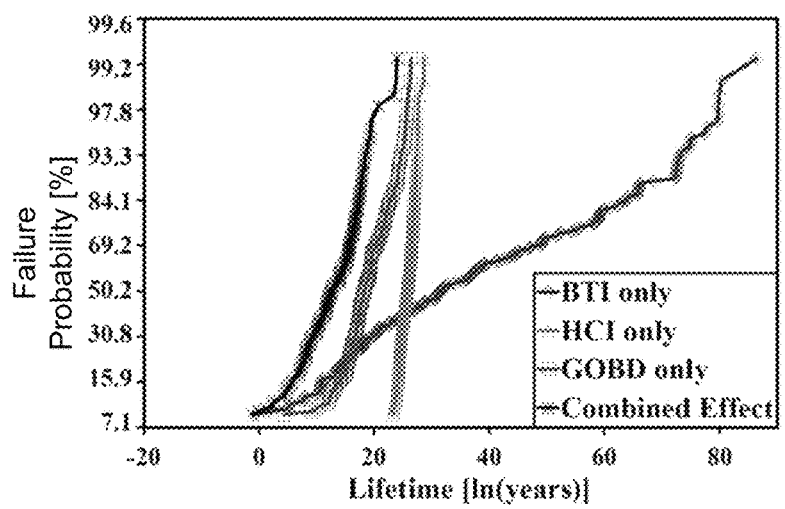
FIGS. 3A-3C are charts illustrating circuit reliability according to example embodiments.
Figure 3B:
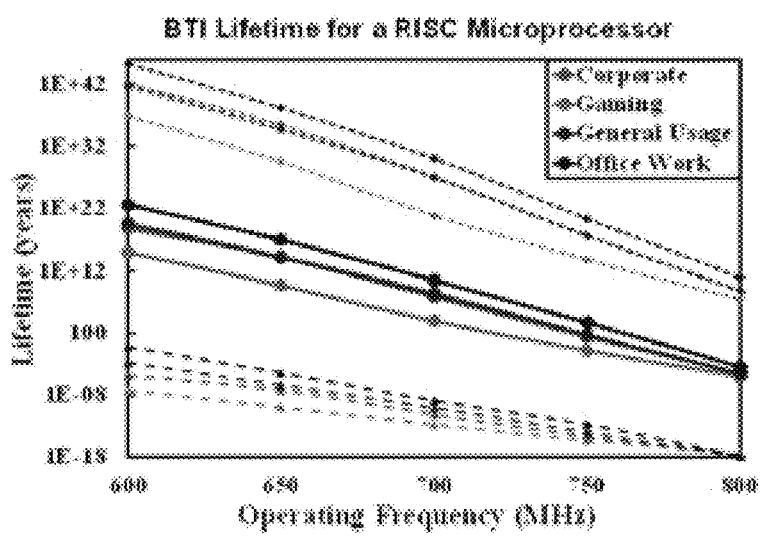
Figure 3C:
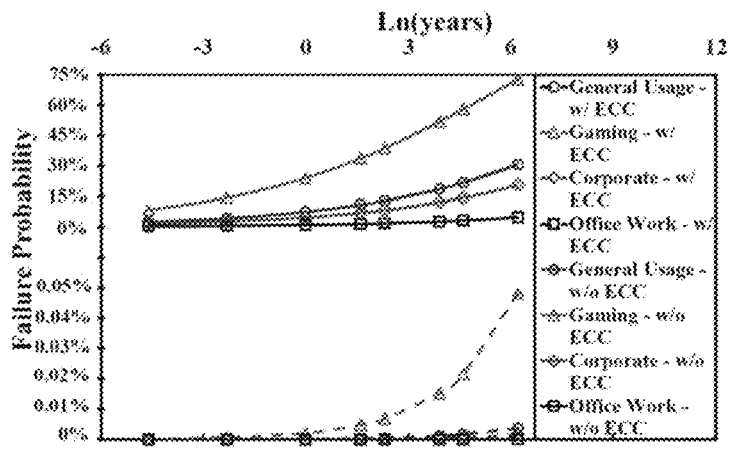
Figure 4A:
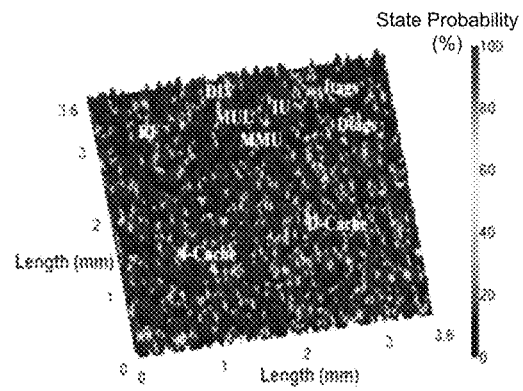
FIGS. 4A-4D illustrate circuit state, net transition rate, temperature, and power grid profiles according to an example embodiment.
Figure 4B:
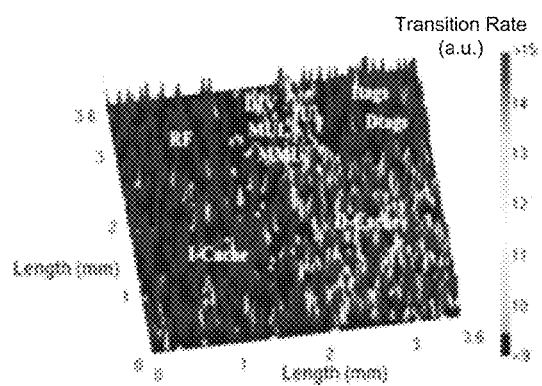
Figure 4C:
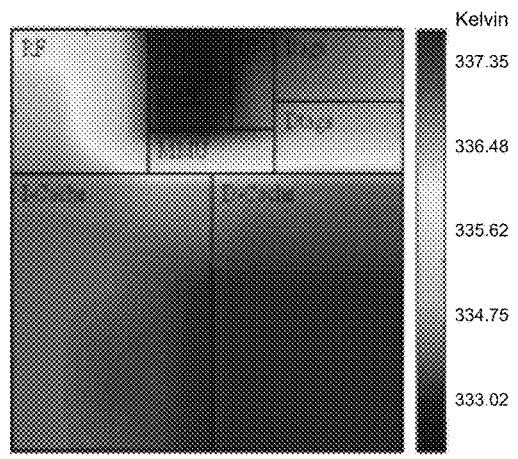
Figure 4D:
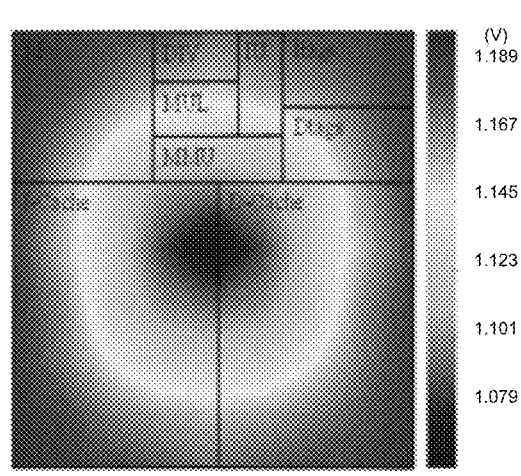

FIG. 3A illustrates the lifetime distributions of various wearout mechanisms (e.g., BTI, HCI, and GTDDB) for an example processor. Although in some embodiments, the lifetime distributions are related to specific wearout mechanisms, this is merely an example. In some cases, the tools may account for different system activities. For example, FIG. 3B is an example charting of expected lifetime for a reduced instruction set computing (RISC) microprocessor at different operating frequencies and usages. In some cases, the system may take into account the use of redundancies. For example, FIG. 3C is a chart illustrating the failure probability over time of a semiconductor both with and without error correcting codes (ECCs) in a memory block.

The system may compute a stress and temperature for each circuit element to improve the accuracy of estimating reliability. In some cases, stress and temperature may be determined for each element by finding a state probability profile (i.e., the probability that each element is at logic "1" during operation), the net transition rate, the temperature profile, and the power grid profile. Example spatial distribution of state probabilities, spatial distribution of net transition rate, temperature distributions, and voltage source (VDD) profile are shown in FIGS. 4A-4D, respectively.

Figure 5:
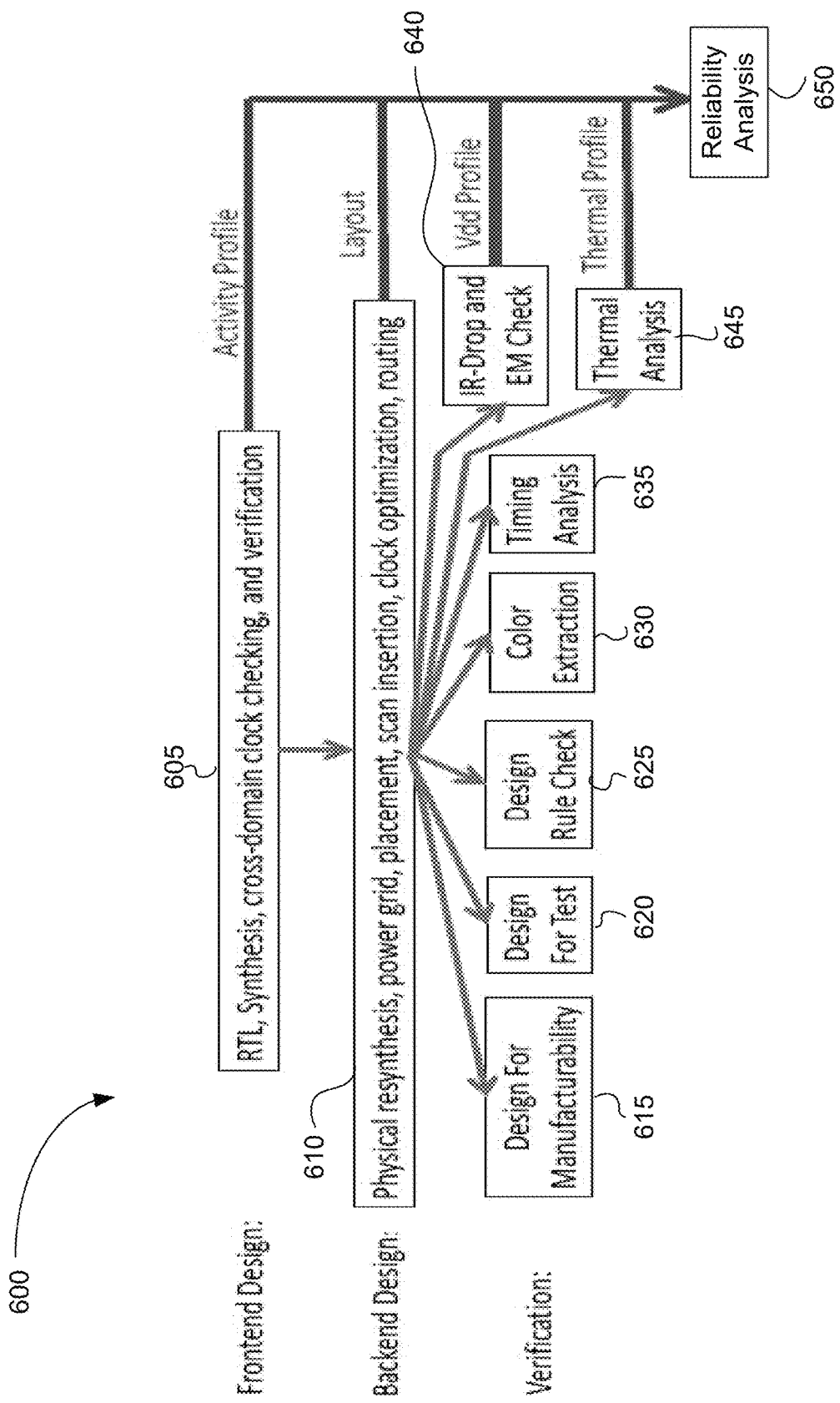
FIG. 5 illustrates a circuit design flow according to an example embodiment.

FIG. 5 illustrates a circuit design flow according to an example embodiment. The design flow 600 begins with frontend design 605 including development of register-transfer level (RTL) code, design space exploration, cross-domain clock checking, synthesis, and verification. An activity profile may be extracted during the frontend design 605 for reliability analysis 650. In some cases, the activity profile may take into account, as non limiting examples, state probability and transition rates. Next, backend design 610 can include physical resynthesis, power grid placement, scan insertion, clock optimization, and routing. The layout may be established during the backend design 610 and provided for the reliability analysis 650. Then, the verification checks are performed on the design including manufacturability design 615, test design 620, designing rule check 625, color extraction 630, and timing analysis 635. In addition, IR drop and EM checks are performed 640 creating a VDD profile, and thermal analysis is performed 645, creating a thermal profile. The VDD profile, the thermal profile, the activity profile, and the layout are provided for reliability analysis 650. The IR drop and EM check 640, the thermal analysis 645, and the reliability analysis 650 will be described below in greater detail according to one or more example embodiments.

In order to determine the lifetime distribution for mechanisms that are described with a time-to-failure distribution (electromigration (EM), stress-induced voiding (SIV), gate oxide breakdown (GTDDB), backend dielectric breakdown (BTDDB), and middle-of-line time-dependent dielectric breakdown (MTDDB) (hard failures)), the semiconductor layout is broken down into features: vias (for EM and SIV); dielectric segments (for BTDDB and MTDDB); and transistors (for GTDDB). The lifetime distribution of each feature is computed based on its geometry, stress, and temperature. Then the chip lifetime distribution is determined by statistically combining millions of lifetime distributions.

Figure 6A:
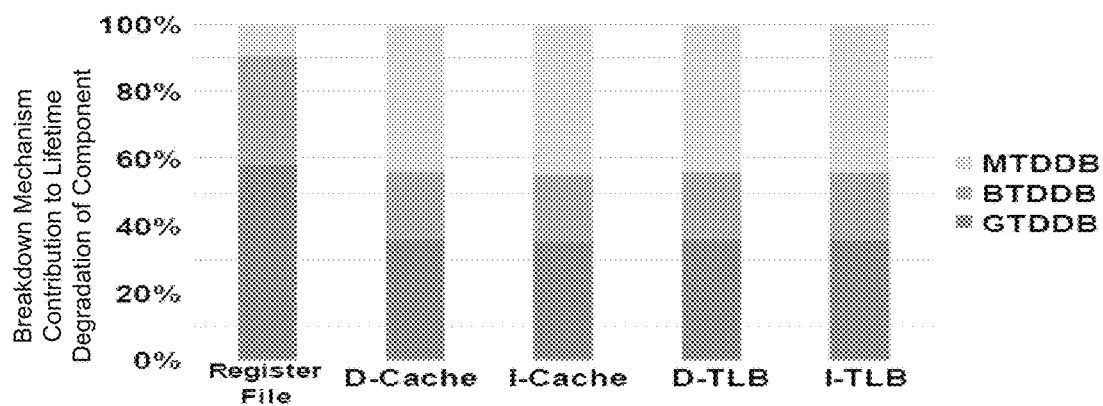
FIG. 6A illustrates the percentage contribution of dielectric breakdown mechanisms to the lifetime degradation for each memory block according to an example embodiment.
Figure 6B:
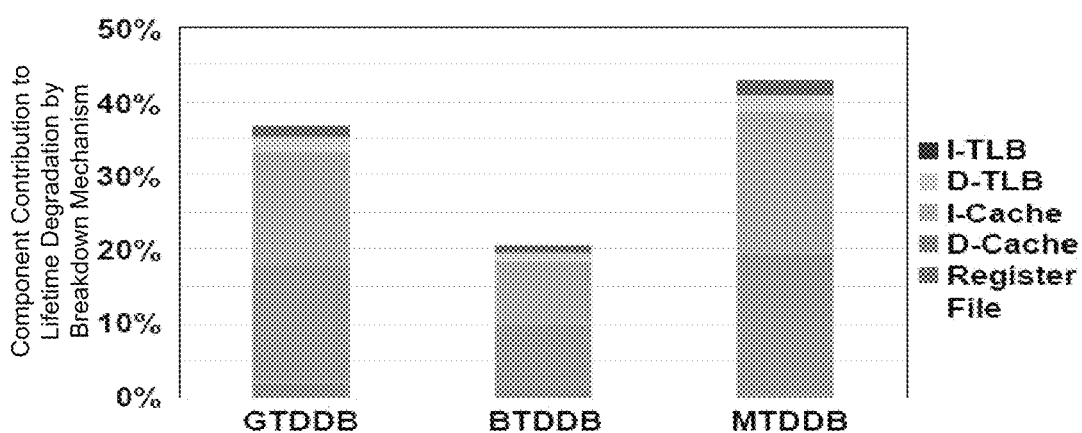
FIG. 6B illustrates the percentage contribution of the memory blocks to the lifetime degradation from the dielectric breakdown mechanisms according to an example embodiment.

FIG. 6A illustrates the percentage contribution of dielectric breakdown mechanisms to the lifetime degradation in five memory blocks according to an example embodiment. FIG. 6B illustrates the percentage contribution of the five memory blocks to the lifetime degradation from the dielectric breakdown mechanisms according to an example embodiment. One of ordinary skill will understand that the wearout mechanisms (GTDDB, MTDDB, and BTDDB) and memory blocks (Register File, D-Cache, I-Cache, D-TLB, and I-TLB) illustrated in FIGS. 6A and 6B are merely examples, and fewer, additional, or alternative wearout mechanisms and memory blocks are considered within the scope of the disclosure.

The related art attempts to reduce the effects of EM and SIV through the use of design rules. For example, certain design rules restrict current density per wire width and the total metal area above and connected to a via. However, these rules are not a function of design size and, therefore, do not explicitly relate to lifetime. Thus, for larger or more complicated designs, unexpected wearout can occur even when the design rules are followed. In addition, the design rules may limit flexibility to meet a performance requirement, and the related art fails to address design rule violations or their impacts.

In the related art, failure rates due to GTDDB are estimated by relating total gate area to lifetime expectancy. However, such a rudimentary approach fails to consider stress distribution or redundancy, creating errors in lifetime estimation. The related art further fails to estimate the vulnerability of designs due to MTDDB and BTDDB.

Some wearout mechanisms (BTI, HCI, and GTDDB soft breakdown) manifest as circuit degradation over time. However, lifetime estimation depends on performance specifications, and is calculated as the time when the circuit fails performance specifications. Circuit performance analysis may be used to determine the lifetime distribution for such wearout mechanisms in addition to other wearout mechanisms that manifest more abruptly.

Running RTL or SPICE simulations of a complete microprocessor to determine an activity profile of a memory may not be feasible in some cases. Accordingly, in some embodiments FPGA simulation may be used to generate an activity and stress profile, as described below with reference to FIG. 11. However, this is merely an example, and one of ordinary skill will understand that alternative simulation methods may be used.

Figure 7:
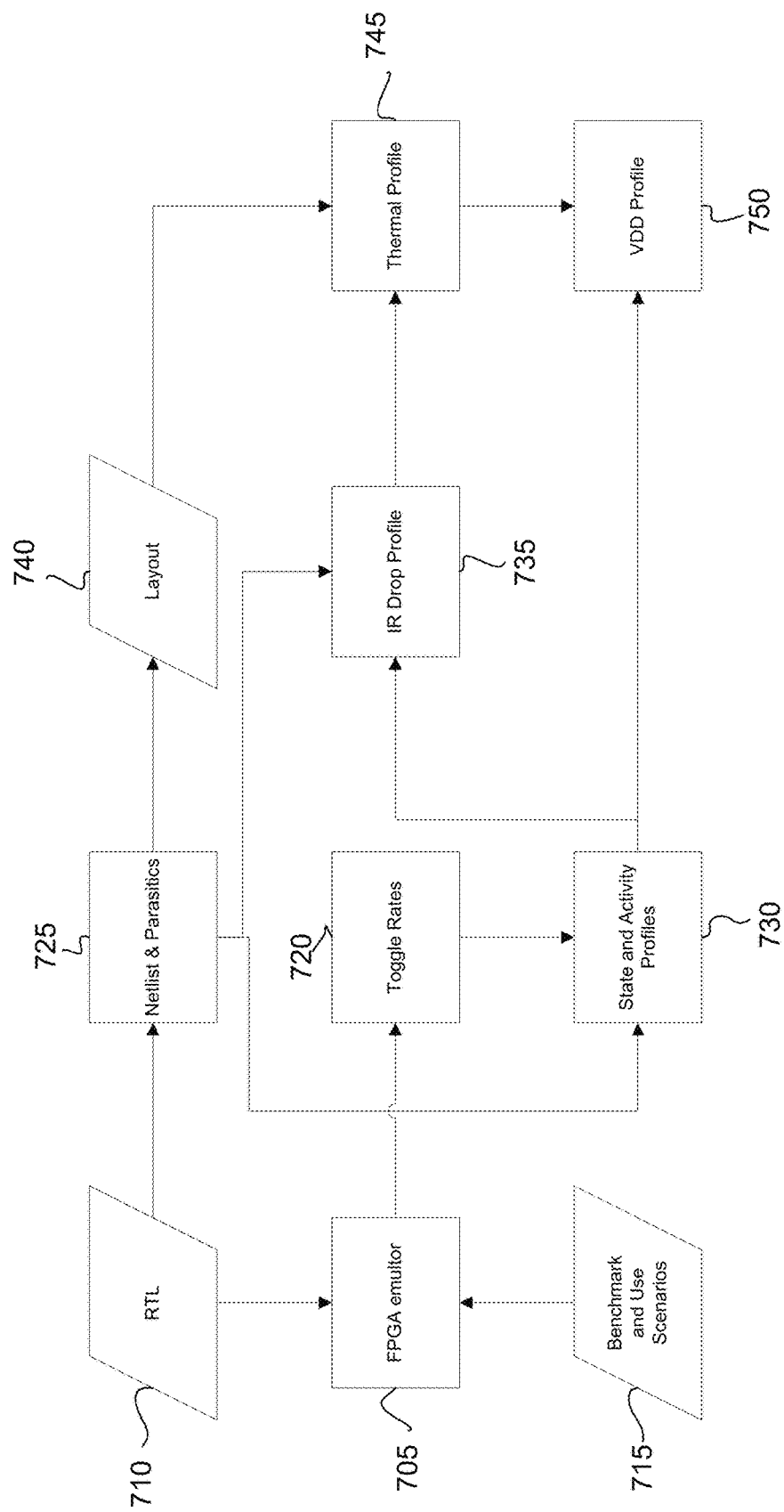
FIG. 7 illustrates a flow diagram for determining temperature and stress of a circuit according to an example embodiment.

FIG. 7 illustrates a flow diagram for determining temperature and stress of a circuit according to an example embodiment. The flow operates with data from the frontend design (such as behavior modeling), where critical input patterns are identified. Referring to FIG. 7, an FPGA emulator 705 receives an RTL code 710, and benchmark and use scenarios 715. The FPGA emulator 705 creates a list of toggle rates 720 for the circuit. FPGA emulation may be used to simulate microprocessors efficiently, but this is merely an example. The RTL code 710 is used to generate a circuit netlist (i.e., a list of the terminals of electronic components in a circuit and a list of the electrical conductors that interconnect the terminals) with resistive and capacitive (RC) parasitics 725.

The toggle-rate 720 and the netlist 725 are used to generate state (e.g., duty cycle) and activity profiles 730 of the circuit. Although the toggle-rate 720 is identified, this is merely an example, and additional or alternative input/output (I/O) activities could be considered in generating an activity profile 730 of the circuit. The activity profile 730 and the netlist 725 are used to generate an IR drop profile 735. The circuit netlist with parasitics 725 is further used to generate a layout 740 of the circuit, which is utilized along with the IR drop profile 735 to generate a thermal profile 745. The thermal profile 745 and the activity profile 730 are used to generate a VDD profile 750. Generating the various profiles is discussed in greater detail below.

The state and activity profiles 730 can be determined when the netlist is available. The thermal profile may be determined from the layout. Hence, data can be captured from throughout the frontend and backend design process, for example, as described above with reference to FIG. 5.

Figure 8:
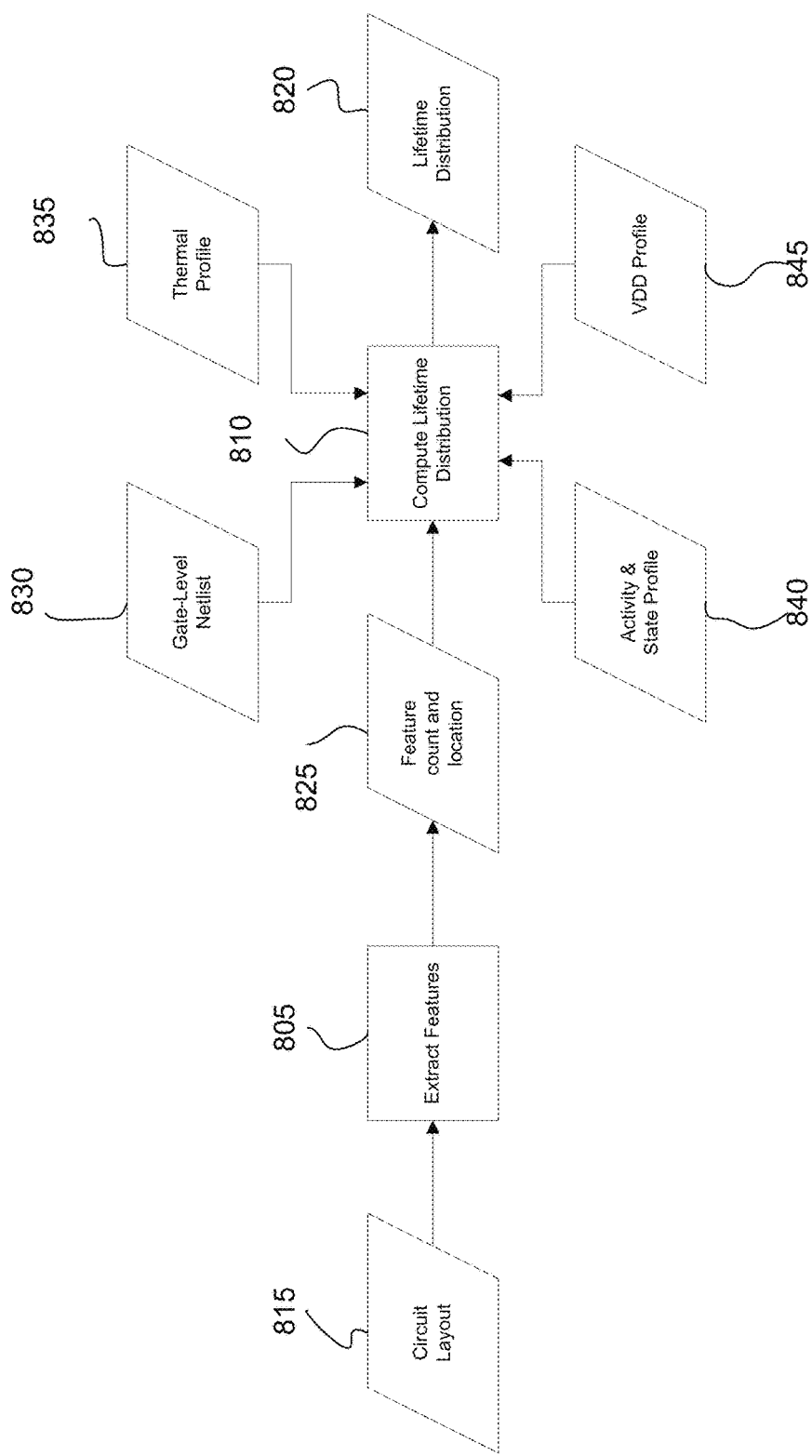
FIG. 8 is a flow diagram of a method of determining circuit lifetime distribution according to an example embodiment.

FIG. 8 is a flow diagram of a method of determining the lifetime distributions of circuit features (e.g., vias, dielectric segments, and transistors) according to an example embodiment. The method of FIG. 8 includes extracting 805 features from a circuit layout 815 and computing 810 the lifetime distribution of the features. The feature extraction 805 creates feature count and location data 825. The lifetime distribution of the circuit 820 is determined based on the feature count and location data 825, the lifetime distributions of the individual features (810), as well as the gate-level netlist 830, thermal profile 835, activity and state profile 840, and VDD profile 845. In some cases, the profiles 835-845 and the netlist 830 are linked to the extracted features to estimate feature lifetime. These resulting distributions may be combined to estimate the full chip lifetime distribution 820 for each considered feature. Redundancy and error correcting codes may also be accounted for when combining the lifetime distributions of the features. In some cases, the computation of the lifetime distribution of the circuit 820 may be based on one or more circuit profiles, such as a thermal profile, an activity profile, a state profile, a voltage source profile, and an IR drop profile.

In some cases, the method described with reference to FIG. 8 may identify wearout mechanisms characterized by time-to-failure models of hard breakdown. These wearout mechanisms may include EM, SIV, GTDDB, MTDDB, and BTDDB. In some cases, the extracting may include identifying dielectric segments and vias together with relevant parameters of the connected metal above the vias. For example, for BTDDB, feature extraction software may use a bucket sort algorithm to find the length and width of each dielectric segment.

EM analysis may require the extraction of vias, since EM failures may occur at via sites. The connected line length for each via must also be extracted, because only connected lines longer than the Blech length are vulnerable to wearout. Therefore, in some cases, vias connected to short metal lines may be considered immortal.

SIV analysis may include the extraction of vias and the width of the metal above the via. Larger metal volumes are associated with greater stress due to the mismatch of temperature coefficients of the materials.

GTDDB analysis may include the extraction of transistors and their sizes. MTDDB analysis may include the extraction of contacts next to gates with less than a minimum space and their respective orientations, so that misalignment can be taken into account.

As a non-limiting example, consider a circuit that is composed of n components, each modeled with a Weibull distribution, for each wearout mechanism. Then there are n characteristic lifetimes $\eta_i$, and n shape parameters, $\beta_i$. If we consider GTDDB, the characteristic lifetime $\eta_i$ of a component may be given as:

$$\eta_i = \frac{A_{ox}\left(\frac{1}{WL}\right)_i^{\frac{1}{\beta_i}} e^{-\frac{1}{\beta_i}} V_i^{a+bT} e^{\left(\frac{c}{T}+\frac{d}{T^2}\right)}}{s_i},$$

where W and L are device width and length respectively, s is the probability of stress, T is temperature, V is gate voltage, and a, b, c, d, and $A_{ox}$ are fitting parameters, which can include, for example, the activation energy between 0.6 and 0.9 eV.

In some embodiments, circuit performance analysis for determining a circuit lifetime distribution includes: determining a temperature and stress for the circuit at the component level; finding the time-to-failure distribution for wearout mechanisms for each layout feature that are modeled using time-to-failure functions at the feature level; and finding the time-to-failure distribution for the full system by combining the time-to-failure distributions for each layout feature and wearout mechanisms.

The characteristic lifetime of the circuit, $\eta_{circuit}$, is a combination of the Weibull distributions and is solvable using:

$$1 = \Sigma_{i=1}^{n}(\eta_{circuit}/\eta_i)^{\beta_i}.$$

Similarly, the shape parameter of the circuit may be found using:

$$\beta_{circuit} = \Sigma_{i=1}^{n} \beta_i (\eta_{circuit}/\eta_i)^{\beta_i}.$$

In a case where each component has a same shape parameter β, which may be assumed in some implementations, $\eta_{circuit}$ may be calculated as:

$$\eta_{circuit} = (\Sigma_{i=1}^{n} \eta_i^{-\beta})^{-1/\beta}.$$

In some cases, the circuit analysis of various failure mechanisms may be run in parallel.

Figure 9:
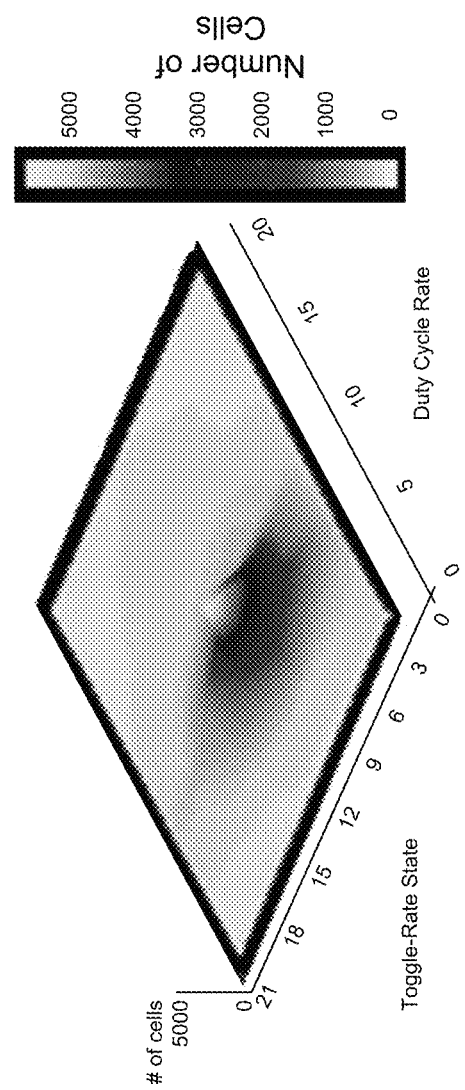
FIG. 9 illustrates a stress-state distribution according to an example embodiment.

In the related art, stress distributions are assumed to be arbitrary. However, this is not always a realistic assumption. Rather, as shown in FIG. 9 illustrating an example stress-state distribution for a 32 KB memory, stress may be due to a combination of duty-cycle (e.g., state) and toggle-rate (e.g., activity).

Certain wearout mechanisms (e.g., BTI, HCI, and soft GTDDB) are associated with parametric degradation, causing failures when parametric degradation becomes severe enough to violate circuit performance specifications. Hence, some embodiments include simulating circuit performances and determining the time-to-failure of performance specifications due to parametric degradation.

Performance specifications are also sensitive to process, voltage, and temperature (PVT) variables. Therefore, statistical simulations are useful to determine the lifetime distribution. These statistical simulations depend on the block being analyzed (e.g., memory or logic), as will be discussed in greater detail below.

The method may incorporate PVT in cell and interconnect modeling, Monte Carlo simulations, and characterization with multivariate adaptive regression splines (MARS). MARS handles the modeling of high dimensional spaces efficiently, and thus is beneficial because the number of parameters is very large when accounting for PVT in combination with aging parameters.

Cell characterization may be performed early and completed once for a technology node. Other elements for circuit analysis may require a full circuit layout, but can be done in parallel with other verification steps (e.g., timing analysis). Determining the lifetime distribution of logic blocks is highly parallelizable, since the last step of Monte Carlo simulations is independent for each random sample.

The lifetime distributions for different features may be useful in creating targeted reliability tests that can be carried out. Such targeted testing may be capable of detecting more wearout faults in a shorter amount of time. Creation of the targeted reliability tests requires feasible accelerated test conditions, known as acceptability regions. Acceptability regions may define, for example, a range of voltages and a range of temperature regions that the circuit can be subjected to for performing HTOL testing. In some cases, it is expected that, when testing within acceptability regions, failures will occur at a high enough frequency and the test time will not be overly long, so that data generated may be used in a statistically meaningful way. The test conditions may be limited by three factors: a sufficiently large failure probability, sensitivity of the failure probability to process variations, and a high selectivity for each wearout mechanism.

The acceptability region can also be subdivided into selectivity regions; wherein each selectivity region (defined, for example, as a range of voltages and a range of temperatures), is expected to have a high probability of failure for a specific wearout condition but a low probability of failure due to all other wearout conditions. If there are no test conditions where there is good selectivity for a particular failure mechanism, a larger sample size is needed, together with diagnosis, in order to generate failures due to the particular failure mechanism.

Determination of the acceptability region shows that many of the wearout mechanisms can be isolated in circuits by appropriately choosing the correct test conditions. Hence, a sequence of lifetime results for each mechanism can be determined. These lifetime results can be used to determine key wearout model parameters, such as the characteristic lifetime, together with voltage and temperature acceleration factors, and can be extended to a complete set of wearout mechanisms, including BTI, HCI, EM, and SIV. The analysis of more wearout mechanisms will impact selectivity. When selectivity is low, then diagnosis methods may be needed to isolate the cause of failure.

Figure 21A:
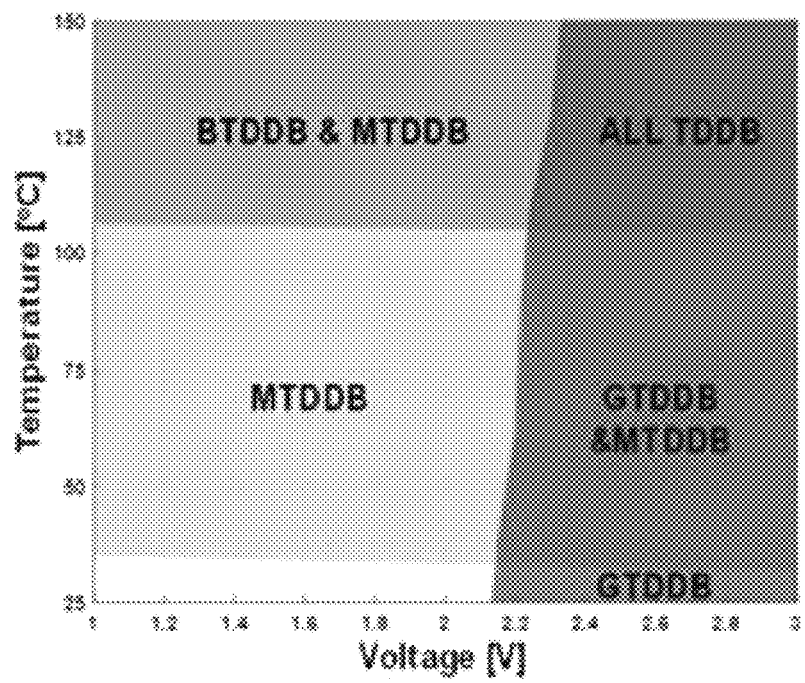
FIGS. 21A and 21B illustrate an acceptability region and a selectivity region according to an example embodiment.
Figure 21B:
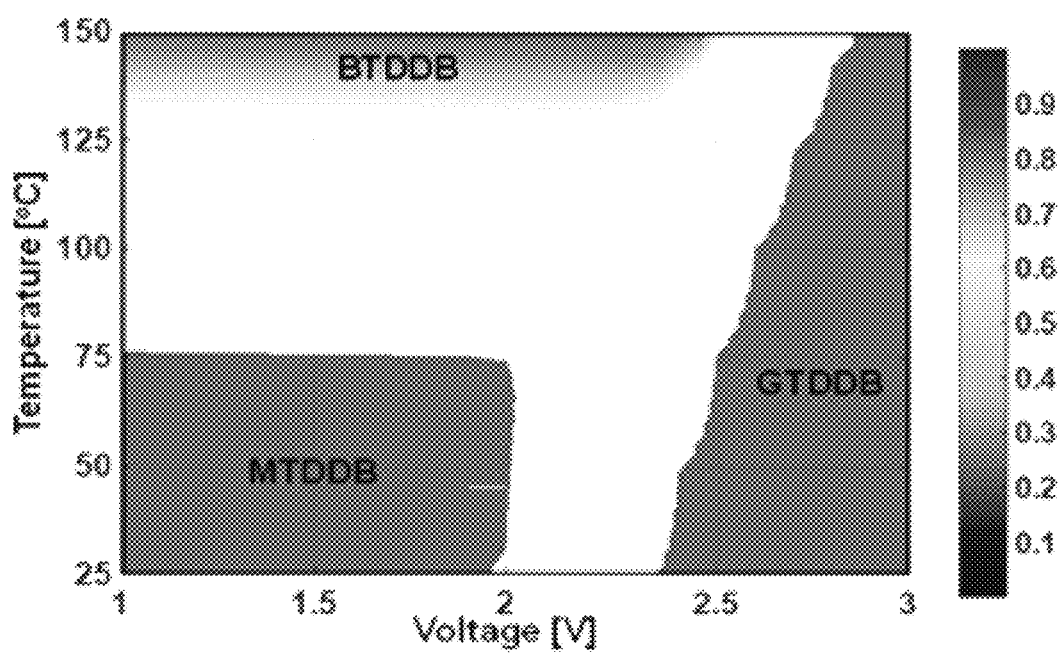

FIG. 21A illustrates acceptability regions according to an example embodiment. As seen in FIG. 21A, different mechanisms of time-dependent dielectric breakdown (GTDDB, MTDDB, and BTDDB) are more likely at different voltage and temperature ranges. Using the acceptability regions, selectivity regions for GTDDB, MTDDB, and BTDDB may be defined, as shown in FIG. 21B. As can be seen in FIG. 21B, the respective regions defined for MTDDB and GTDDB indicate HTOL testing parameters that are very likely to experience, as the limiting mechanism, MTDDB and GTDDB, respectively. However, the region defined for BTDDB does not indicate good selectivity for BTDDB. Therefore, a larger sample size may be needed, together with diagnosis, in order to generate failures for BTDDB. Although wearout mechanisms GTDDB, MTDDB, and BTDDB over variations in temperature and voltage testing conditions are illustrated in FIGS. 21A and 21B, one of ordinary skill will understand that this is merely an example. Additional wearout mechanisms and testing parameters may be considered within the scope of the present disclosure.

An appropriate test plan as illustrated above will provide a sequence of time-to-failure for each wearout mechanism. Given such a set of accelerated lifetimes, one can analyze the data in the same way as one analyzes a set of data from device test structures to extract critical wearout parameters. For example, for GTDDB, BTDDB, and MTDDB, lifetime obeys an electric field model (E-model), as would be known of one of ordinary skill, as follows:

$$t_{bd} = A * e^{-\gamma E^m} * e^{\frac{E_a}{kT}},$$

where $t_{bd}$ is the time to breakdown of a the circuit, A and m are fitting parameters, γ is the electric field acceleration factor, k is Boltzmann's constant, $E_a$ is the activation energy, T is temperature, and E is the electric field in the dielectric where E=V/s and V is the supply voltage and s is the space across which the voltage is applied. With a sequence of data being separated by mechanism (e.g., GTDDB, BTDDB, and MTDDB), the model parameters (A, γ, $E_a$) can be computed by regression, given the samples that vary supply voltage and temperature.

In some instances, the proposed methodology is different than certain approaches in the related art, which typically involves a single test condition usually aimed to detect GTDDB only. Meanwhile, in some embodiments, the method uses a wide variety of test conditions to better isolate the causes of failure in circuits.

Moreover, lifetime results from a single test condition targeting GTDDB can also be misleading. For example, in SRAM, lifetime simulation may indicate that the limiting mechanism (i.e., the most likely failure mechanism) is MTDDB. However, MTDDB is not detectable under typical HTOL test plans, and may not be detectable under accelerated tests at all. Accordingly, a product would not be accurately qualified for a specified lifetime using only HTOL as in the related art.

Modeling Overview

BTI degradation results from static stress to a transistor kept in a fixed state for too long. BTI has two forms: Negative BTI (NBTI), which affects PMOS transistors when a '0' is applied to the gate, and Positive BTI (PBTI), which affects NMOS transistors when a '1' is applied. BTI is generally associated with shifts in threshold voltage for a transistor, as well as other transistor characteristics. The threshold voltage shift can be modeled with trapping/detrapping theory as a function of time under DC stress ($t_{DC}$) using the following equation:

$$\Delta V_{tp/tn}(DC) = \phi_0(A_{BTI} + B_{BTI} \ln(t_{DC}))e^{-E_a/kT},$$

where $A_{BTI}$, $B_{BTI}$, and k are constants, $\phi_0$ is proportional to the number of traps and may be a function of temperature and voltage, $E_a$ is the activation energy, and T is temperature. One of ordinary skill will recognize that the above is just one model of BTI and alternative models may be considered within the scope of the disclosure. The duty cycle may modulate $\phi_0$ through the Fermi level, which varies as a function of time under stress ($t_{str}$) and time in recovery ($t_{rec}$). Overall, as an example model of BTI, the threshold voltage can be modeled using the following equation:

$$\Delta V_{tp/tn} = \phi_0 \left(\frac{t_{str}}{t_{str} + t_{rec}}\right)(A_{BTI} + B_{BTI} \ln(t_{str} + t_{rec}))e^{-E_a/kT}.$$

Meanwhile, HCI results from degradation that occurs as the state of transistors change states (i.e., flip from on to off and vice versa). The threshold voltage shifts due to HCI may be modeled as:

$$\Delta V_{tp/tn} = A_{HCI}(r_{trans} t_{stress} t_{trans})^n,$$

where $r_{trans}$ is the transition rate (i.e., transitions per unit time), $t_{stress}$ is the total time under stress/operation, $t_{trans}$ is the transition time (i.e., rise or fall time), and $A_{HCI}$ and n are technology dependent constants that relate to the inversion charge, trap generation energy, and hot electron mean free path. As with BTI, one of ordinary skill will recognize that the above-described model of HCI is merely an example, and alternative models are within the scope of the disclosure.

Various models may also be used for soft GTDDB. For example, in the percolation model, during electrical stress, the trap density of an oxide (e.g., $SiO_2$) increases with stress time t as a power law in the anode hole injection model. Stress may be converted to a number of traps based on:

$$N_{trap}(t, V_G) = A e^{BV_G t^\beta} \tau_{ox} W L,$$

where $V_G$ is gate voltage, A, B, and β are fitting constants, and $\tau_{ox}$, W, and L are oxide thickness, gate width, and length, respectively. Soft breakdown (SBD) leakage resistance can be calculated, for example, with the quantum point contact (QPC) model as:

$$R_{SBD} \cong V_G \bigg/ \left[\frac{4e}{\hbar\alpha} N * \exp(-\alpha\Phi) * \sinh\left(\frac{\alpha e(V_G - V_0)}{2}\right)\right],$$

where $V_G$ is gate voltage, φ=3~4 eV, $V_0$=0~0.5V, α=2~3 $eV^{-1}$, $\hbar$ is Plank's constant, e is the charge of an electron, and N is the number of SBD conduction paths. Thus, in this example, the device-level TDDB model introduces two time-dependent resistances for each transistor.

Memory Cells

Some embodiments of the present disclosure relate to an improved analysis of memory. As discussed above, in the related art, estimating wearout due to BTI and HCI fails to consider the effect of error correcting codes (ECCs), real temperature and IR drop profiles of a microprocessor, and the combined effect of BTI and HCI. However, as discussed below, consideration of these elements provides more accurate estimation of reliability.

Figure 10:
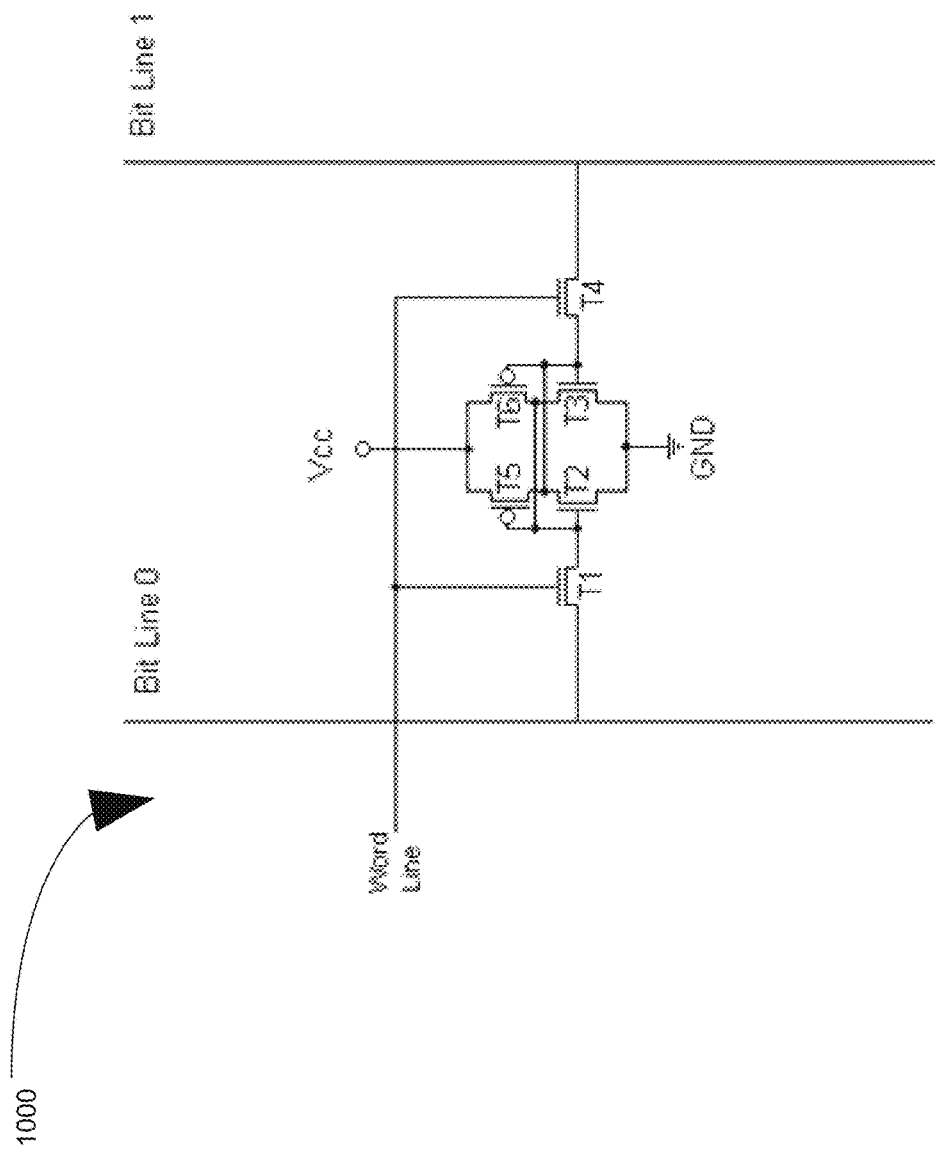
FIG. 10 is a circuit layout of an example memory cell.

For ease of explanation, consider an example cell (e.g., a memory cell in SRAM) depicted in FIG. 10. The memory cell 1000 (e.g., a 6 transistor (6T) memory cell) includes pass transistors T1 and T4 controlled by the Word Line and NMOS transistors T2 and T3 and PMOS transistors T5 and T6 that form an inverter loop to hold information. Bit Line 0 and Bit Line 1 allow read and write operations to the 6T memory cell 1000. The transistors T1-T6 experience HCI and BTI as follows: HCI affects all transistors T1-T6 on a write operation if the logic value flips; T2 and T6 experience PBTI and NBTI, respectively, when the 6T memory cell 1000 stably stores a '0'; and T3 and T5 experience PBTI and NBTI, respectively, when the 6T memory cell 1000 stably stores a '1'. Accordingly, during each cycle, T2, T3, T5, and T6 are either aging or recovering, while T1 and T4 are only affected by BTI when the transistor is being accessed. Therefore, T1 and T4 may be less sensitive to aging than T2, T3, T5, and T6.

Figure 11:
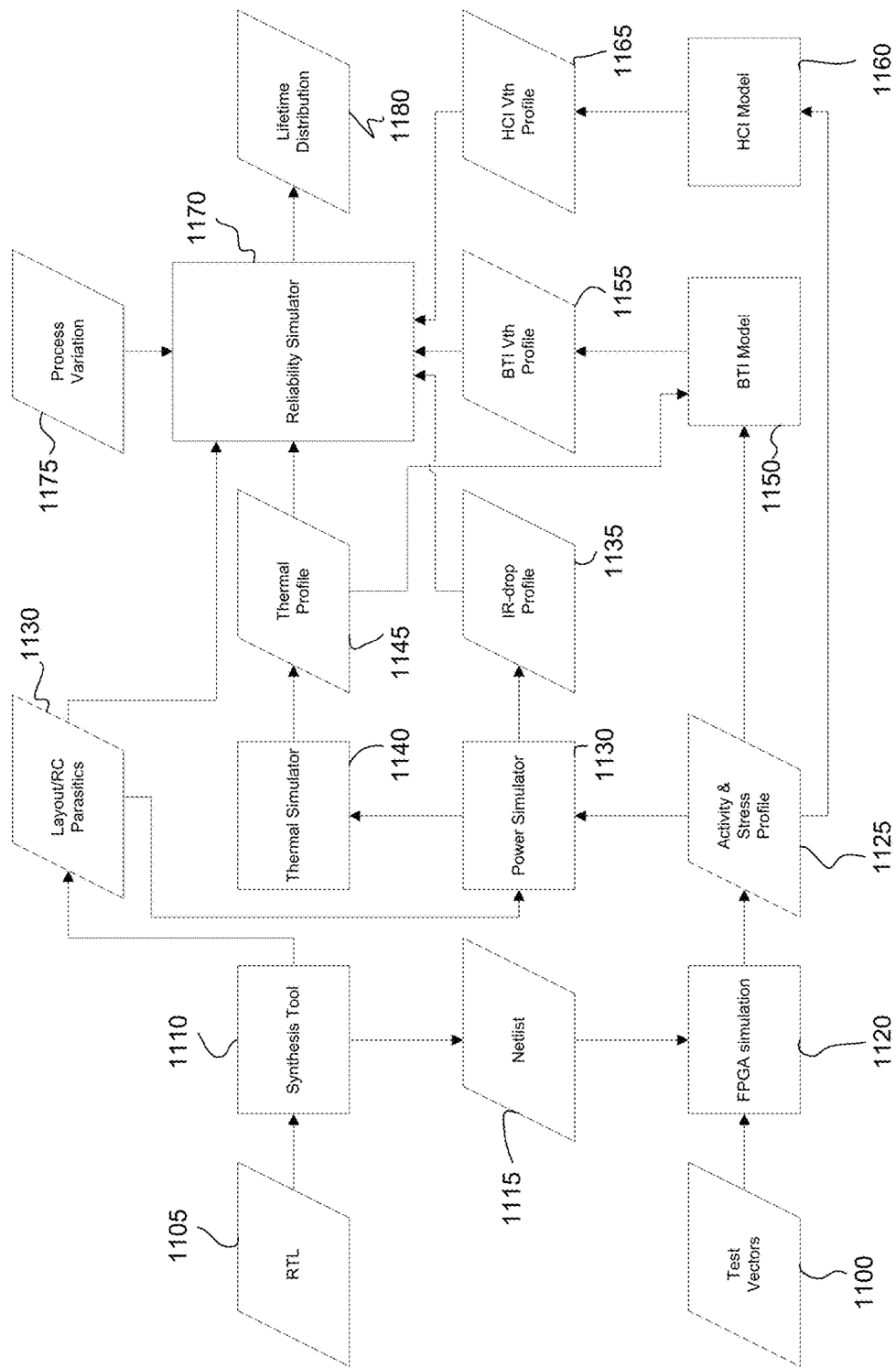
FIG. 11 illustrates a process flow of simulating a memory according to an example embodiment.

In addition, BTI and HCI are influenced by thermal and electrical stress. FIG. 11 illustrates a process flow of simulating a circuit according to an example embodiment.

Referring to FIG. 11, a hardware register-transfer level (RTL) 1105 is synthesized 1110 to create a netlist 1115. The netlist 1115 and test vectors 1100 are utilized by the FPGA simulation 1120 to generate an activity and stress profile 1125. The test vectors 1100 may correspond to parameters for running the simulations, such as elevated voltage or temperature. The synthesis tool 1110 also generates a circuit layout with RC parasitics 1130. The activity and stress profile 1125 and the layout 1130 are used by a power simulator 1130 to generate an IR drop profile 1135, and by a thermal simulator 1140 to generate a thermal profile 1145. The thermal profile 1145 and the activity and stress profile 1125 are used by a BTI model 1150 to generate a BTI profile 1155. An HCI model 1160 uses the activity and stress profile 1125 to generate an HCI profile 1165. A reliability simulator 1170 uses these profiles and process variation 1175 to simulate the circuit and generate a statistical lifetime distribution 1180 of a circuit cell. If we consider a memory as an example, a memory block is composed of many memory cells. The lifetime distributions of each memory cell may differ because each memory cell may experience different temperature, voltage, duty cycle performance, and toggle rate in various use scenarios.

Figure 17:
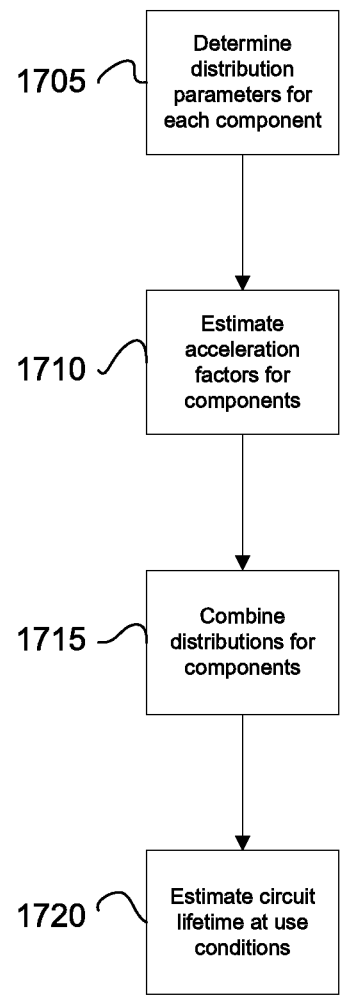
FIG. 17 is a flow chart of a method according to an example embodiment.

FIG. 17 is a flow chart of a method according to an example embodiment. Referring to FIG. 17, a reliability simulator determines 1705 distribution parameters for each component of a circuit, e.g., an analog or digital circuit. The reliability simulator estimates 1710 acceleration factors. This may account for uneven stress conditions experienced by analog circuits within mixed-signal circuits. Finally, the reliability simulator combines 1715 the distributions of the components and estimates 1720 circuit lifetime at use conditions given data on failure rates at high temperature and voltage stress conditions.

In some embodiments, to estimate the life of the full memory or a full circuit, multiple groups of cells may be defined based on sections within a multi-dimensional space defined, as non-limiting examples, by temperature, voltage, duty cycle, and toggle rate. For example, memory cells may be placed into one of the groups based on simulated results for different use conditions, and memory cells within each group may be treated the same. By dividing the memory cells into groups, the simulator may provide a more efficient analysis of the estimated lifetime of the entire memory. One of ordinary skill will understand that this division may be applicable to alternative cell types (e.g., standard cells and FPGA blocks), as is contemplated within the present disclosure.

Determining lifetime for wearout mechanisms associated with degradation may require statistical circuit performance analysis. The lifetime is the statistical distribution for when the circuit will fail to meet performance requirements.

As a non-limiting example of memory, SRAM may be characterized by several performance metrics, including read and retention static noise margins (SNMs), a write margin, a read current (IREAD), and the minimum retention voltage (Vdd-min-ret), as would be understood by one of ordinary skill. The SNMs are defined as the minimum DC noise voltage necessary to change the state of an SRAM cell. The read SNM is measured with the access transistors turned on, while the retention SNM is measured with the access transistors turned off. The write margin is the minimum voltage needed to flip the state of the SRAM with the access transistors turned on. Vdd-min-ret is the minimum voltage required for the SRAM to maintain its state. IREAD is the current flow through pull-down devices when the SRAM is read, and is inversely proportional to access time. Once these performance metrics degrade below a threshold (e.g., a predefined or application dependent threshold), the SRAM is said to have failed.

Figure 12:
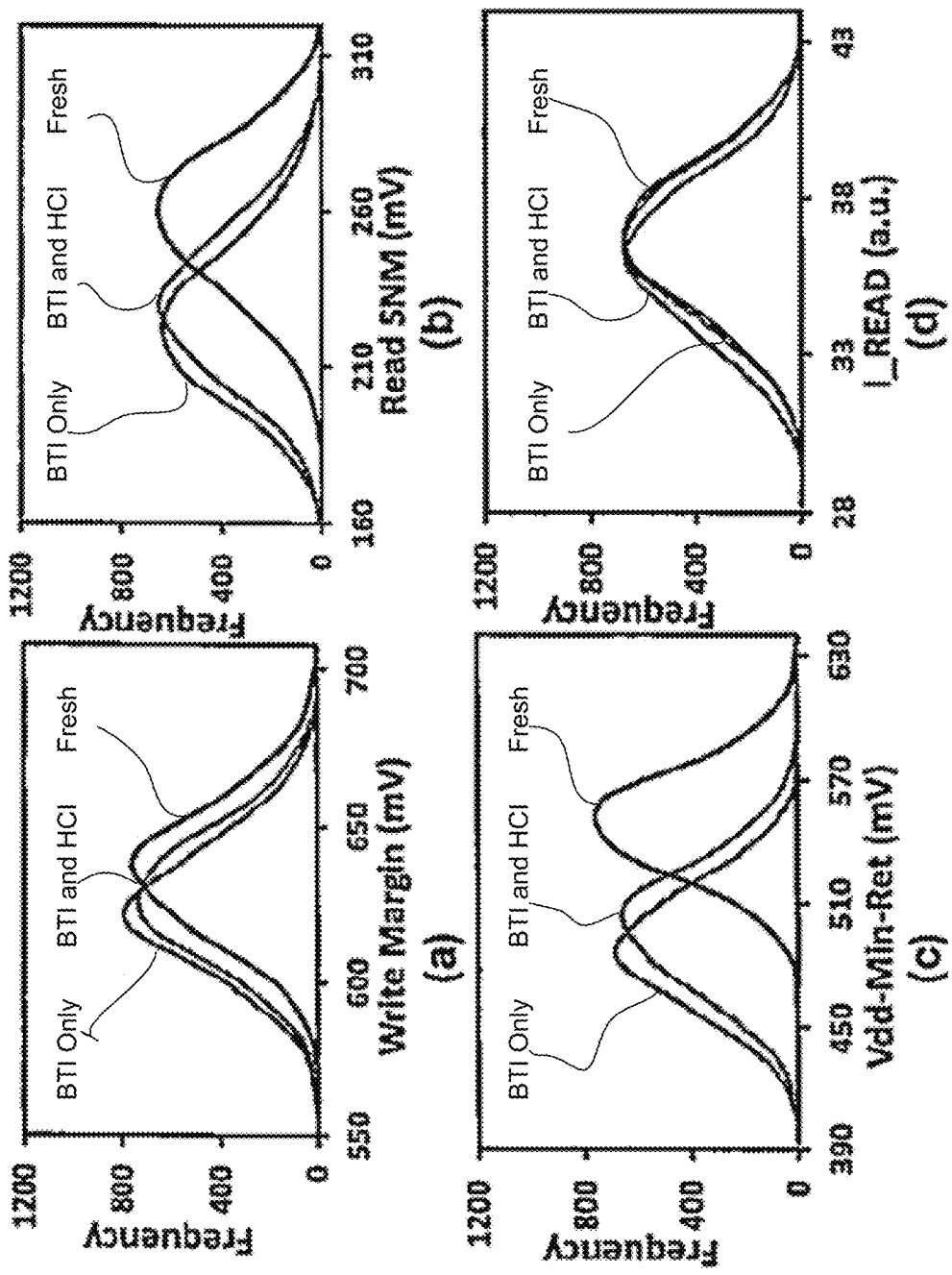
FIG. 12 presents graphs of the effects of BTI and HCI on performance metrics of an SRAM according to an example embodiment.

FIG. 12 presents graphs of BTI and HCI on performance metrics of an SRAM according to an example embodiment. Referring to FIG. 12, the charts illustrate the impact of BTI alone and the combination of BTI and HCI as compared to a fresh circuit for the write margin (a), the read SNM (b), Vdd-min-ret (c), and IREAD (d). As can be seen, although the combined effect of BTI and HCI may be greater than only BTI for some performance metrics (i.e., READ in the example of (d) FIG. 12), for other performance metrics (i.e., the write margin, Vdd-min-ret, and read SNM in the example of (a)-(c) of FIG. 12), HCI mitigates the effect of BTI. Since in some implementations the write margin, Vdd-min-ret, and read SNM are more closely related to SRAM degradation, analysis of the combined effect of BTI and HCI improves lifetime prediction. In addition, since the HCI may be influenced by operating frequency, the mitigation effect of HCI may be increased by increasing an operating frequency of the circuit.

In order to calculate the lifetime probability of a memory block, simulations may be made for an individual SRAM cell, where the stress, temperature, and IR drop profiles are calculated, and a lifetime distribution may be determined. Lifetime distributions may be used to calculate the probability of failure of an SRAM cell, PFbit, as a function of time. Then, the probability of a word failure, PFword in the memory is calculated by:

$$PF_{word}=1-\Pi_{i=1}^{N}(1-PF_{bit_i}),$$

where N is the number of bits in one word.

From the probability of a word failure, the probability of a memory block failure, $PF_{MEM}$, may be calculated. The $PF_{MEM}$ may be calculated by:

$$PF_{MEM}=1-\Pi_{i=1}^{Nword}(1-PF_{word_i}),$$

where $N_{word}$ is the number of words in the memory block. If error correction is utilized, the probability of block failure decreases. As a non-limiting example, BCH codes require 7 extra bits per word to correct one bit per word, and decreases $PF_{word}$. For BCH codes, $PF_{word}$ may be calculated by:

$$PF_{word}=1-\Pi_{i=1}^{N}(1-PF_{bit_i})-\Sigma_{j=1}^{N}[PF_{bit_j}*\Pi_{i\neq j}^{N}(1-PF_{bit_i})].$$

BCH codes is only one example of error correction, and one of ordinary skill would understand that similar analysis may be performed to determine the failure probability of a memory block using different error correction mechanisms.

In some scenarios, memory configuration (e.g., associativity, cache line size, cache size, replacement algorithm used, and error correction) influences memory lifetime. Lifetime simulation may provide information for optimizing a memory configuration. Associativity relates to how a cache can be normalized, and falls into one of three categories: direct mapped, n-way set associative, and fully associative. Higher associativity can improve hit rate, but reduces cycle time and can require more comparators. In addition, higher associativity increases failure rate because cells are more likely to maintain their stored values unchanged, aggravating the effect of BTI.

As an example, memory lifetime simulation can be used to optimize line size and cache size. Cache line size is the number of bytes that can be transferred between main memory and cache in one block. Generally, a larger cache line size improves memory life because cache misses, though rarer, result in BTI recovery periods for more memory units. Meanwhile, larger cache sizes can improve a hit rate. However, larger cache sizes also increase the number of memory cells (i.e., the number of potential points of failure) and the improved hit rate can increase the BTI effect. Accordingly, line size and cache size may be adjusted to balance performance and reliability requirements.

As another example, memory lifetime simulation can be used to analyze the choice of replacement algorithm and the impact of error correction. When the cache is full and a new entry needs to be entered, a replacement algorithm is used to determine which portions of memory to overwrite. More efficient replacement algorithms may increase hit rate, but, as with cache size and associativity, increase the effect of BTI. Error correction, such as ECCs, can detect and correct some internal data corruption of memory. The use of any error correction tends to improve the life of memory, and different error correction mechanisms should be considered when estimating the life of memory in a circuit.

Accordingly, in some implementations of the present disclosure, when analyzing the lifetime of memory, one or more of cache size, associativity, error correction, and replacement algorithms are taken into account to optimize the design of a memory. In some embodiments, a simulator may recommend adjustment of one or more memory configurations to improve memory lifetime. One of ordinary skill will recognize that this is merely an example, and it is contemplated that a simulator may recommend adjustments for various circuit features in addition to memory (e.g., logic cells).

Cell Characterization for Logic

Some embodiments of the present disclosure relate to systems and methods for characterizing a cell (e.g., a logic or memory cell or standard cell) and statistical timing analysis thereof. In the related art, statistical timing analysis of a cell combines process corner analysis for die-to-die variation in channel length with random variation in threshold voltage. Such approaches fail to consider within-die variations of the manufacturing process or environmental variation within the cell. Accordingly, one aspect of the present disclosure relates to cell characterization over a full process domain and domain of operation. Such characterization may be used to improve timing analysis of a cell.

Statistical timing analysis (StTA) can generally be categorized into two classes: Monte Carlo (MC) StTA and Probabilistic StTA. MC StTA is based on sample-space enumeration, while Probabilistic StTA is based on statistical operations between random variables. Probabilistic StTA may exhibit some runtime advantages, but has difficulty accounting for non-normal (e.g., skewed) distributions. Thus, MC StTA is used as a reference to validate the accuracy of StTA implementations, with SPICE MC StTA being generally regarded as the most accurate. However, SPICE simulations have a fairly high runtime cost and may not be practical to use for an entire circuit, while non-SPICE MC StTA may not be able to accurately manage a high number of parameters (for example, including within die variations).

Accordingly, one aspect of the present disclosure is the use of Multivariate Adaptive Regression Splines (MARS) and variation models for StTA. MARS models may replace SPICE models of individual cells, while reducing simulation time and processing requirements. In some implementations, as compared to replacing SPICE with linear quadratic cell modes, MARS-based StTA may achieve better accuracy and reduced runtime.

In some aspects of the present disclosure, MARS is employed to characterize a fitted function between response variables (e.g., gate delay or slew time) and parameters (e.g., PVT). MARS is an adaptive procedure that uses piecewise linear segments, and is able to capture essential nonlinearities (and 'ignore' negligible parameters) and interactions without manual intervention. This piecewise nature allows the entire high-dimension space of a cell to be split into multiple subspaces with unique regression models using piecewise hinge functions.

A hinge function has the form of $(x-t)_+$ or $(t-x)_+$, defined as:

$$(x-t)_+ = \begin{cases} x-t, & \text{if } x > t \\ 0, & \text{otherwise} \end{cases}$$
$$(t-x)_+ = \begin{cases} t-x, & \text{if } x < t \\ 0, & \text{otherwise} \end{cases},$$

where t is a constant, referred to as the knot. MARS forms a collection of hinge-function pairs for each explanatory parameter $X_j$ with knots at $x_{j1}, x_{j2}, \ldots x_{jM}$, with M being the number of experiments. MARS models have the following form:

$$f(\vec{X}) = \beta_0 + \Sigma_{t=1}^T \beta_t h_t(\vec{X}),$$

where $h_t(\vec{X})$ is a basis function. The MARS model builds in a forward stepwise addition phase and a backwards stepwise deletion phase.

Figure 13:
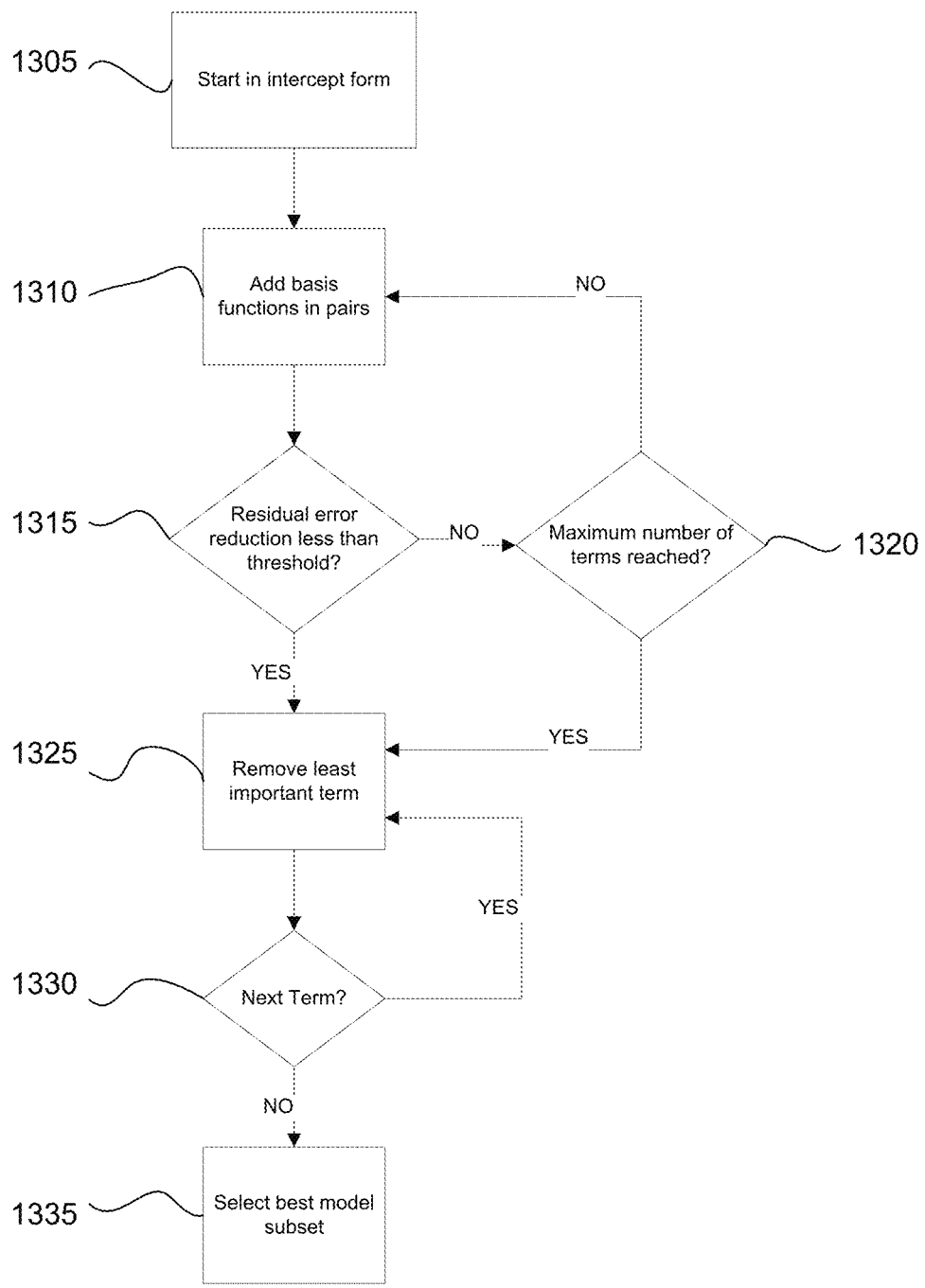
FIG. 13 is a flow diagram of building a MARS model according to an example embodiment.

FIG. 13 is a flow diagram of building a MARS model (e.g., a gate model or an interconnect model) according to an example embodiment. In the forward phase, MARS starts 1305 with an intercept term then repeatedly adds 1310 basis functions in pairs to the model step by step, finding the pair of basis functions that give the maximum reduction in the sum-of-squares residual error. Each new basis function consists of a term multiplied by a hinge function. The forward phase continues until a change in residual error is smaller than a threshold 1315 (implying that further refinement would provide minimal improvement) or a maximum number of terms is reached 1320.

The backward phase is then used to prune the model creating greater generalization. The backward phase chooses the best model subset, for example, using Generalized Cross Validation (GCV) to choose the best model subset trading goodness-of-fit against model complexity. The backward phase removes 1325 terms on-by-one in inverse importance (e.g., according to GCV), until all terms are removed 1330, and then selects 1335 the best model subset (e.g., the models of each size having the lowest GCV).

In some embodiments, MARS may be used to characterize standard cells and interconnects. In some embodiments, MARS may be used to characterize one or more circuit blocks (e.g., FPGA elements, flip-flops, and analog components).

A model of a circuit may also include the interconnect network. Timing analysis may include the load of the interconnect in the cell model together with the delay of the interconnect that is loaded by next stage cells. For an interconnect network, its input admittance function Y(s) and its transfer function H(s) can be expanded at s=0 using a Taylor series as follows (only showing one transfer function)

$$H(s) = m_0 s^0 + m_1 s^1 + \ldots$$

$$Y(s) = y_0 s^0 + y_1 s^1 + \ldots,$$

where $m_0, m_1, \ldots$ and $y_0, y_1, \ldots$ are the moments of their respective functions.

In some embodiments, a Pi-model may be used as a reduced-order model of Y(s). The Pi-model estimates the input admittance of RC interconnects, and a representative structure of the Pi-model is shown in 1410 of FIG. 14. The values of C1, R, and C2 are determined by the first through third moments of the original network Y(s), reducing the sample space to three parameters in the load for a standard cell. In some embodiments, these three parameters C1, R, and C2, along with the PVT parameters construct the parameter space for standard cell characterization.

In some embodiments, a stable two-pole (S2P) approximation is used to produce a reduced-order model of H(s), while preserving the first three moments of H(s). The reduced-order model H˜(s) may be a second-order model with two stable poles, given as:

$$H'(s) = \frac{k_1}{s+p_1} + \frac{k_2}{s+p_2}.$$

Figure 14:
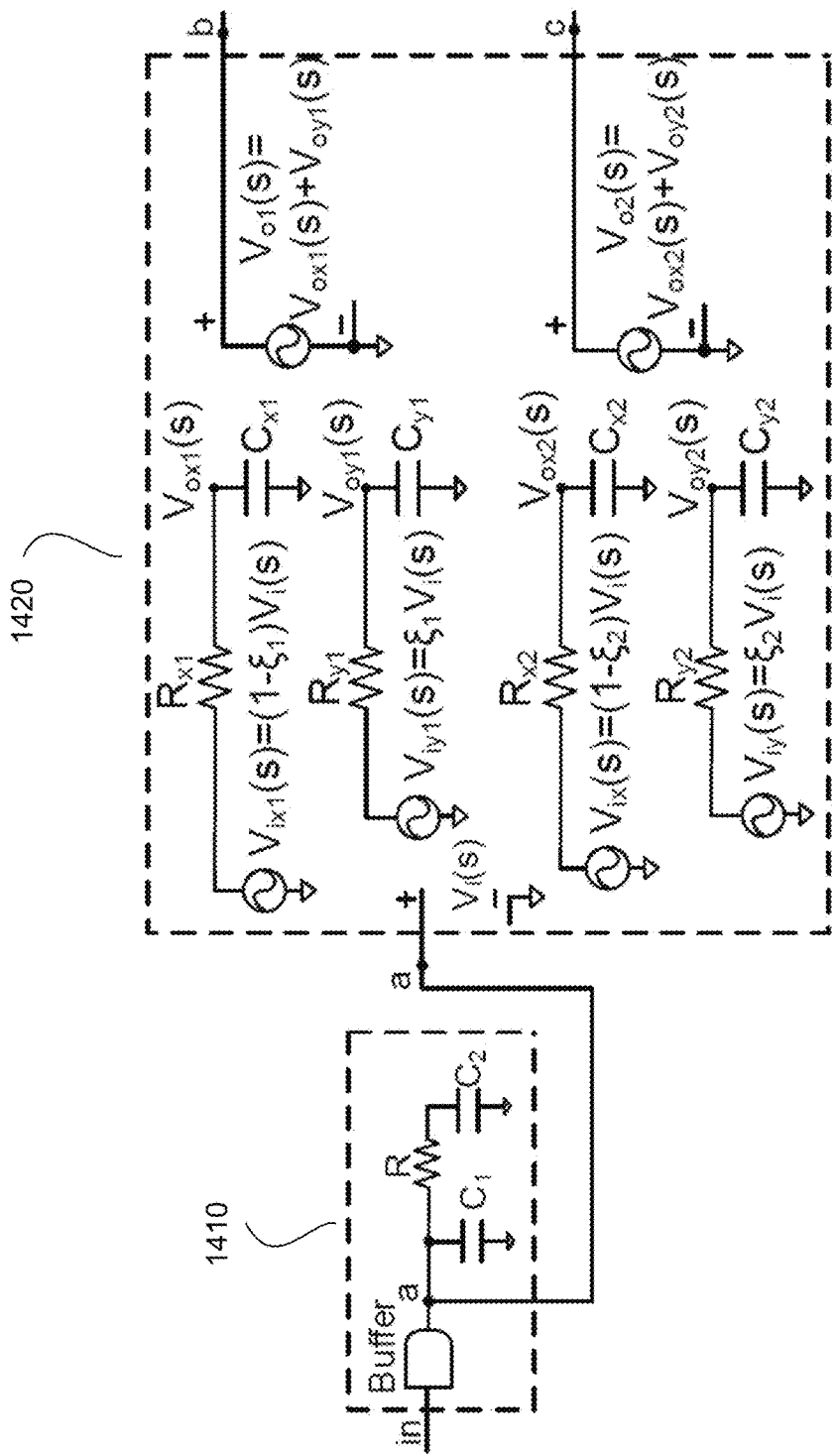
FIG. 14 illustrates a Pi-Model and $H^{\sim}(s)$ model according to an example embodiment.

H˜(s) may not be includable in a netlist for circuit-level simulation, and is therefore implemented as 1420 in FIG. 14. The reduced-order model H˜(s) is given as:

$$H'(s) = \frac{\frac{1-\xi}{R_x C_x}}{s + \frac{1}{R_x C_x}} + \frac{\frac{\xi}{R_y C_y}}{s + \frac{1}{R_y C_y}},$$

where $R_x C_x$ is determined by $1/p_1$, $R_y C_y$ is determined by $1/p_2$, and $\xi$ is determined by $k_1$ and $p_1$. Setting $C_x$ and $C_y$ to a fixed value, e.g., $10^{-15}$F, leaves $R_x$ and $R_y$ to be calculated accordingly. Thus H˜(s) may be simplified to a three-parameter space $R_x$, $R_y$, and $\xi$.

Besides variation in the load being incorporated into the cell model, the cell model may include the input capacitance of the loading cells. The input capacitance of loading cells also includes variation. Adding input capacitances of fanout gates as part of the interconnect model cause the Pi and H˜(s) models to vary. However, in some cases, it is impractical to run a whole process (i.e., moment generation and calculations of $C_1$, R, $C_2$, $R_x$, $R_y$, and $\xi$ for every variational sample). Accordingly, in some embodiments, the parameters may be modeled using a first-order Taylor-series at nominal values for each component. For example, $C_1$ of the Pi-model may be estimated as:

$$C_1 = C_{1_{nominal}} + \sum_{i=1}^{N} \alpha_i (C_{fanout_i} - C_{fanout_{i_{nominal}}}),$$

where $C_{fanout\_i\_nominal}$ is the nominal value of $C_{fanout\_i}$, $\alpha_i$ is the first derivative of $C_1$ with respect to $C_{fanout\_i}$, $i \in \{1, 2, \ldots N\}$, and $C_{1\_nominal}$ is the nominal value of $C_1$. The other parameters (e.g., R, $C_2$, $R_x$, $R_y$, and $\xi$) may be represented by similar functions. In some cases, the error associated with using the Taylor series to calculate the parameters is less than 0.1%.

Figure 15:
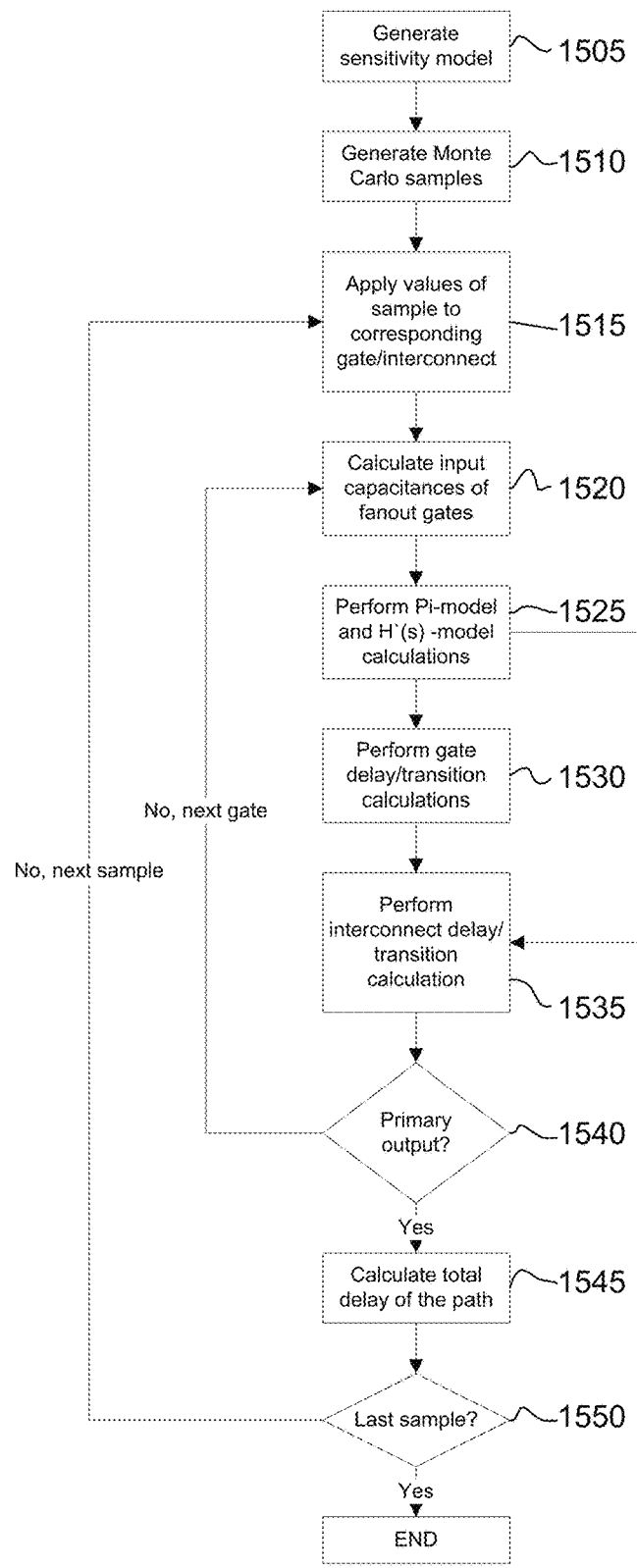
FIG. 15 is a flow diagram of performing path-delay analysis according to an example embodiment.

FIG. 15 is a flow diagram of performing path-delay analysis according to an example embodiment. One of ordinary skill will understand that the method described with reference to FIG. 15 may be applied to an analysis of additional portions of a circuit. Referring to FIG. 15, the method includes generating 1505 a sensitivity model for each interconnect. For example, the sensitivity model may be generated in the form of the Taylor-series discussed above. The method further includes generating 1510 MC samples. Although MC is used to generate 1510 the samples in FIG. 15, this is merely an example and alternative sample generation methods may be used.

Next, the samples are applied 1515 to corresponding gate/interconnects, and the input capacitances of fanout gates are calculated 1520. Then the Pi and H˜(s) model calculations are performed 1525, followed by performing 1530 the gate delay/transition calculation and performing 1535 the interconnect delay/transition calculation.

If the result is not the primary output (1540—No), a next input capacitance is calculated 1520. Once the primary output is determined (1540—Yes), a total path delay is calculated 1545. Then the values of a next sample is applied 1515 (1550—No), until a total path delay for a last sample (1550—Yes) is calculated.

Figure 16:
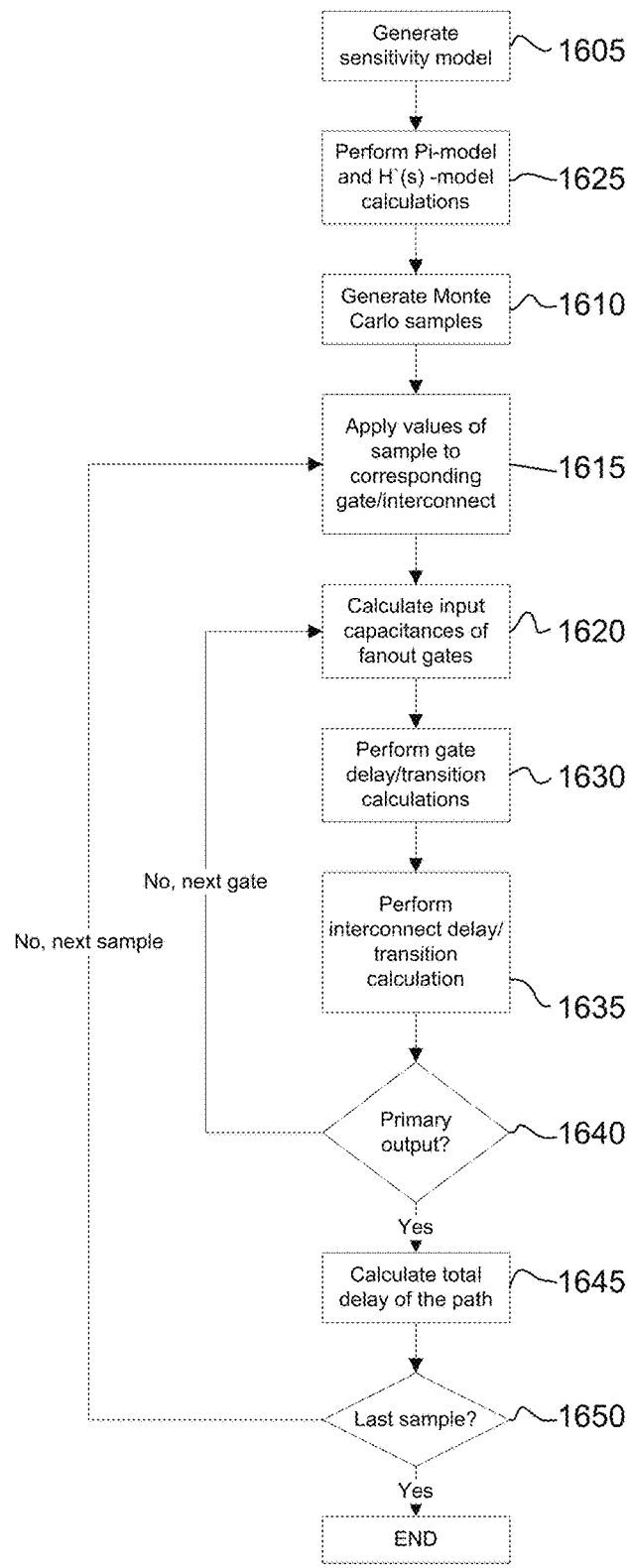
FIG. 16 is a flow diagram of performing path-delay analysis according to an example embodiment.

FIG. 16 is a flow diagram of performing path-delay analysis according to another example embodiment. One of ordinary skill will understand that the method described with reference to FIG. 16 may be applied to analysis of additional portions of a circuit. Many of the elements of FIG. 16 are similar to the corresponding elements of the method described in FIG. 15. Accordingly, a detailed description of these elements will not be repeated for compactness.

Referring to FIG. 16, the method includes generating 1605 a sensitivity model for each interconnect, and performing 1625 Pi-model and H˜(s) model calculations. The method further includes generating 1610 samples. Next, the samples are applied 1615 to corresponding gate/interconnects, and the input capacitances of fanout gates are calculated 1620. Then, the gate delay/transition calculation is performed 1630 and the interconnect delay/transition calculation is performed 1635.

If the result is not the primary output (1640—No), a next input capacitance is calculated 1620. Once the primary output is determined (1640—Yes), a total path delay is calculated 1645. Then the values of a next sample is applied 1615 (1650—No), until a total path delay for a last sample (1650—Yes) is calculated. One of ordinary skill will recognize that in the method described in FIG. 16, the Pi-model and the H˜(s) model calculations are performed 1625 before applying 1615 values of samples to gate/interconnects, which may reduce processing time and load.

Circuit Analysis for Logic

As discussed above, the PVT variations, as well as device wearout (such as BTI, HCI, and time dependant dielectric breakdown (TDDB)), can degrade a circuit. A degraded circuit fails to work, for example, when logic delay exceeds the clock period. Therefore, the aging effect, along with PVT variations, should be taken into account for circuit timing simulations. However, the related art recognized a difficulty in accurately characterizing timing degradation and added an extra guard-band on top of the worst PVT corners, assuming worst-case conditions for all transistors. However, excessive-guard banding may unnecessarily sacrifice processor performance. Therefore, according to some implementations, there is provided a simulator that can combine the affects of both PVT variation and the aging affect. In some cases, the simulator achieves a PVT-aging-aware StTA while simultaneously considering the effect wearout mechanisms, e.g., BTI, HCI, and TDDB, which can be incorporated into standard cell models. It will be understood by one of ordinary skill that including fewer, additional, or alternative wearout mechanisms into standard cell models would be considered within the scope of the disclosure.

In some examples, PVT process parameters such as channel length variation ΔL, ΔVth threshold voltage variation ΔVth, supply voltage variation ΔVdd, temperature variation ΔT, and input transition time (Slope), may be considered for each cell. In some embodiments, length and threshold voltage may vary, either independently or in a correlated way, for PMOS and NMOS devices. The voltage, temperature, and slope parameters may be applied to the cell level.

Figure 18A:
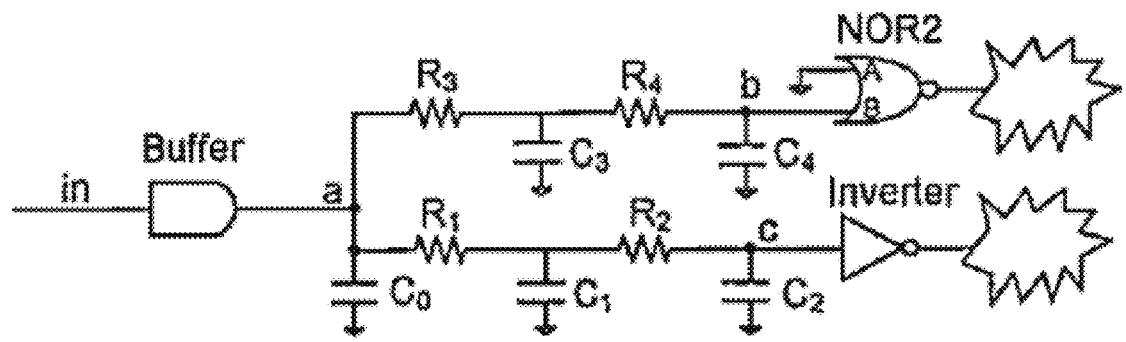
FIGS. 18A and 18B illustrate a portion of a gate-level circuit according to an example embodiment.
Figure 18B:
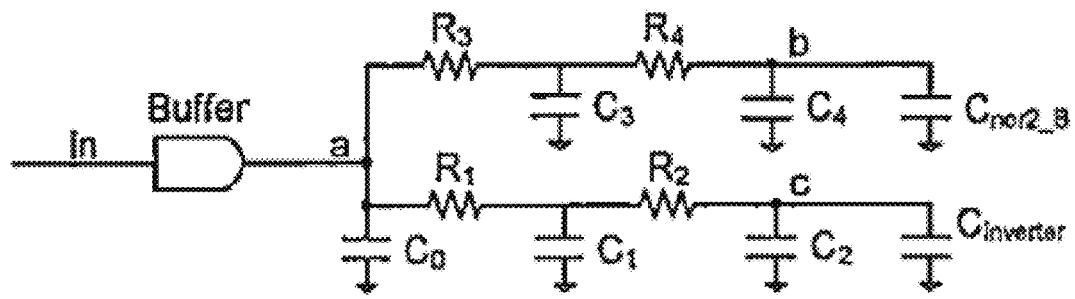

In some embodiments, standard-cell and interconnect modeling is done using the MARS technique. FIG. 18A illustrates a small portion of a gate-level circuit according to an example embodiment. The buffer gate has two fanout gates, an inverter, and a NOR2 gate. The load seen by the buffer is the interconnect network together with the input capacitances of the fanout gates, as illustrated in FIG. 18B. By modeling fanout gates as input capacitances, as in FIG. 18B, circuit-level timing analysis can be done stage by stage.

For standard cell characterization, for each transistor of a gate, the variation of channel length $\Delta L$ and threshold voltage $\Delta Vth$ may be considered. $\Delta L$ is derived from process variation, while $\Delta Vth$ is additionally affected by BTI and HCI. Thus, $\Delta Vth$ may be represented as:

$$\Delta Vth = \Delta Vth_{process} + \Delta Vth_{BTI} + \Delta Vth_{HCI}.$$

TDDB introduces two additional parameters (gate-to-source resistance, RG2S, and gate-to-drain resistance, RG2D) for each transistor of a gate. Therefore, in some embodiments, each transistor has four parameters ($\Delta L$, $\Delta Vth$, RG2S, and RG2D) in the gate-level model.

$\Delta VDD$ and $\Delta T$ are used to represent supply voltage and temperature of a gate, respectively. In some embodiments, supply voltage and temperature are assumed to be the same for all transistors of a gate. The three parameters of the Pi-model (Rpi, Cpi1, and Cpi2) represent the gate load. Also, for each timing arch, the input slew time (Slope) is included. Thus, for a gate containing N transistors, the 4N device parameters ($\Delta L$, $\Delta Vth$, RG2S, and RG2D), together with the six global parameters ($\Delta VDD$, $\Delta T$, Rpi, Cpi1, Cpi2, and Slope), result in a total of 4N+6 parameters for each gate. In some embodiments, SPICE simulations may train a MARS model.

Figure 19:
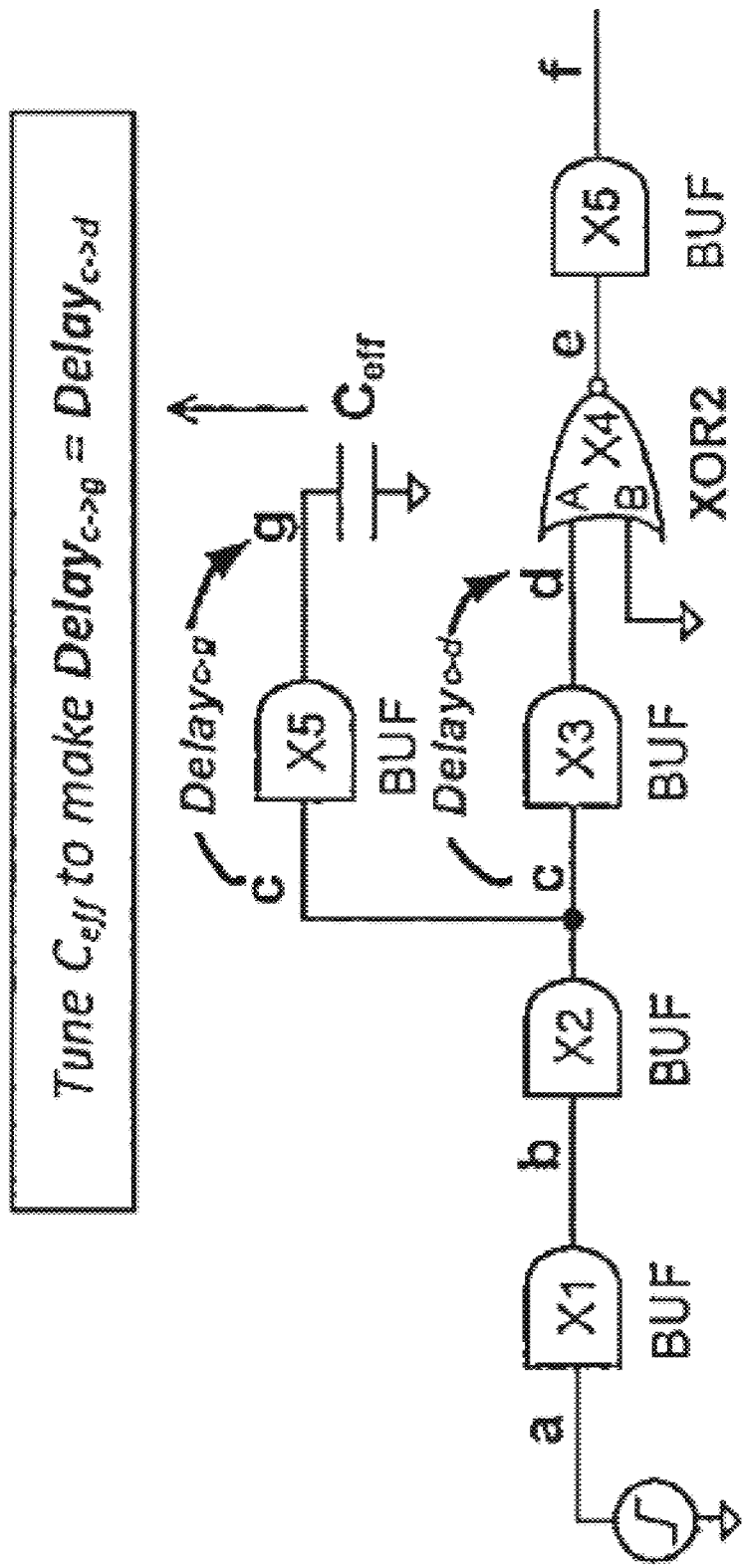
FIG. 19 is a diagram of a test circuit according to an example embodiment.

According to one aspect of the disclosure, a model of input capacitance takes into account variations of input capacitance (for example, caused by PVT variations). An input capacitance at various PVT parameters for an input to XOR2 may be determined experimentally (e.g., through simulation), for example, using the test circuit illustrated in FIG. 19. In this example, the input capacitance to XOR2 is at node d. Ceff (effective capacitance of the XOR2 gate) of FIG. 19 is tuned until the delay between nodes c and g is equal to the delay between nodes c and d. As PVT varies, the capacitance of XOR2 varies. Once all PVT parameters are considered, the input capacitance may be modeled as a first-order linear regression in the following form:

$$C_{input\_cap} = k_0 + \Sigma_{i=1}^{n} k_i X_i,$$

where n is the number of considered PVT parameters, $k_0$ is a constant, $X_i$ denotes a considered PVT parameter, and $k_i$ is a first order sensitivity coefficient. Other types of two-input gates and single input invert gates can also be modeled in this manner. As non-limiting examples, an inverter gate may consider seven parameters, and a two-input gate may consider eleven parameters. Although the input capacitance has been described being determined experimentally using a test circuit, this is merely an example, and alternative methods may be used to model input capacitance.

An RC interconnect network is a linear system with an input and one or more outputs. As described above with reference to FIG. 14, the load for the buffer may be modeled with a Pi-model. The delay through the interconnect is modeled as shown in 1420 of FIG. 14.

The transfer functions Hi(s) corresponding to respective outputs of the linear system may be simplified, as described above, to $H^\wedge(s)$ and a three-parameter space Rx, Ry, and $\xi$.

For interconnect modeling, in some embodiments, five exploratory parameters (Rx, Ry, and $\xi$ of the $H^\wedge(s)$ model, and VDD) and Slope may be considered. The modeling of interconnects may be similar to that used for standard cell characterization by utilizing MARS to model the interconnect network.

As discussed above, adding input capacitances of fanout gates as part of the interconnect model causes the Pi and $H^\wedge(s)$ models to vary, and, thus a detailed discussion will not be repeated for compactness.

The MARS approach may then be used to model a function between response variables (e.g., gate delay or slew time) and the explanatory parameters (PVT and aging parameters). The MARS process is discussed in more detail above and will not be repeated for compactness.

The MARS technique may be used to characterize standard cells and interconnects. As discussed above, by modeling fanout gates as input capacitances in the interconnect network, a circuit can be divided into gate-level stages for timing analysis (see above with reference to FIG. 18B). The total delay in each stage is the sum of the gate delay and the interconnect delay.

By using the Pi-model and the $H^\wedge(s)$ model, the diagram (see, e.g., FIG. 18B) may be further transformed to provide a single stage timing analysis as shown in FIG. 14. Referring to FIG. 14, circuit portion 1410 may represent the gate timing analysis, while circuit portion 1420 may represent the interconnect timing analysis.

The device-level wearout models are used to get some of the parameters from the gate delay models, which are then used in StTA. In some cases, the StTA framework includes two procedures: path identification (e.g., block-based StTA) and timing computation (e.g., path-based StTA).

Figure 20:
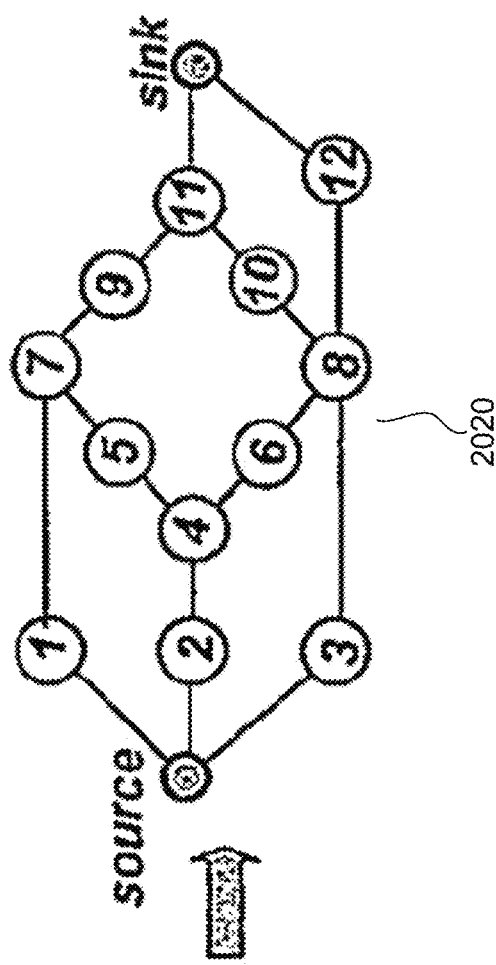
FIG. 20 illustrates a timing graph abstracted from a combinational circuit according to an example embodiment.
Figure 20:
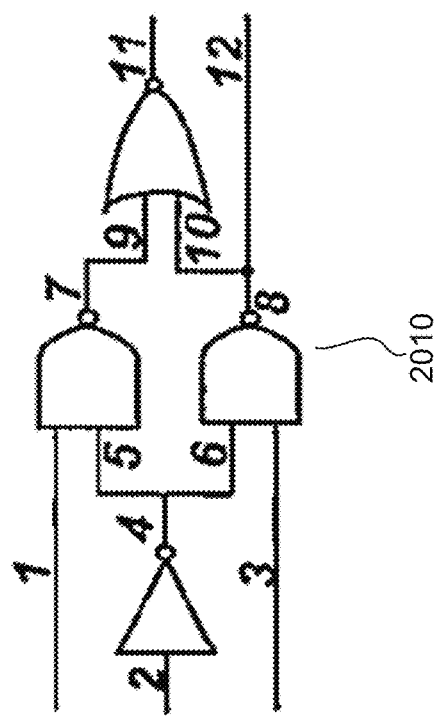

Block-based StTA performs statistical critical-path extraction. Probabilistic block-based StTA performs statistical sum and max operations between random variables required by Monte Carlo block-based StTA. A timing graph (2020) may be abstracted from a combinational circuit (2010), for example, as shown in FIG. 20. After forward traversal of the timing graph, the circuit delay is obtained from a maximum arrival time of all primary outputs. A back traversal of the timing graph may be used to extract some critical paths by identifying the top circuit delays. For each Monte Carlo sample, the forward and backward traversals are repeated to produce a number of critical paths. Thus, a set of critical paths may be obtained in the presence of process variations. Block-based StTA may be used to select paths, but is not necessarily accurate for timing analysis because switching details of the path are not known.

Path-based StTA receives the extracted critical paths and performs accurate input-vector-dependent timing analysis to generate a circuit-delay distribution. For each Monte Carlo sample, the value of each path delay is calculated, and the maximum of the path delays is taken as the circuit delay. The circuit-delay distribution is found after a respective circuit delay is determined for a number of samples. As would be understood by one of ordinary skill, the circuit-delay distribution may be determined by combining the respective circuit delays determined for the number of samples.

Figure 22:
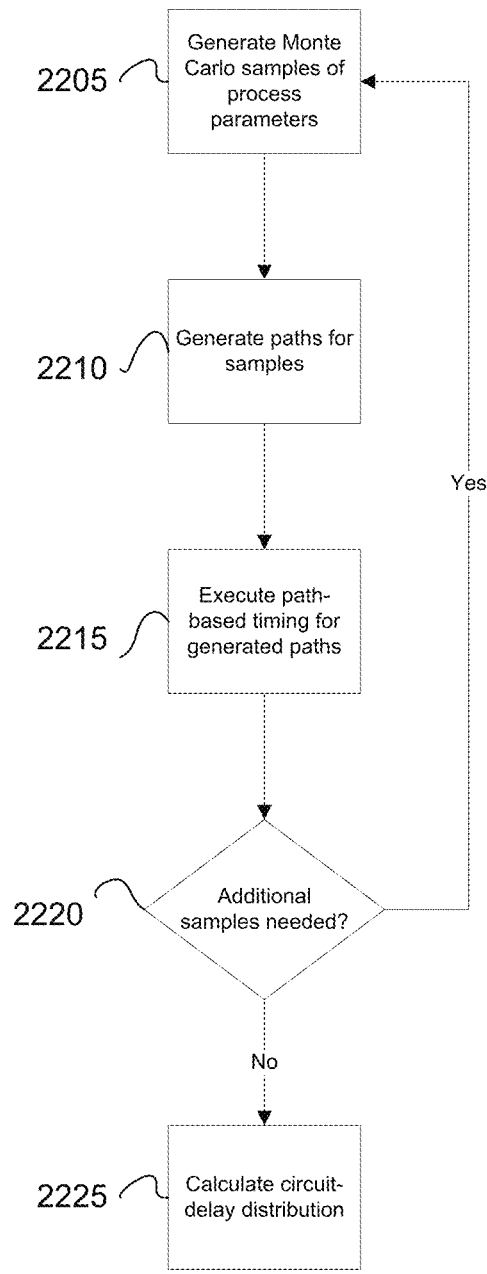
FIG. 22 is a flowchart of statistical simulation according to an example embodiment.

FIG. 22 is a flowchart of statistical simulation according to an example embodiment. A plurality of process parameters are generated 2205 using Monte Carlo samples. Next, one or more paths are generated 2210 for each Monte Carlo sample. Then, path-based timing is executed 2215 for each of the selected paths based on the process parameters. Next, if more timing simulations are needed (2220—Yes), more process parameters are generates 2205. Otherwise (2220—No), the paths may be combined 2225 to determine a circuit-delay distribution.

Some related art approaches, perform path identification and timing computation sequentially. However, these related art approaches are inaccurate. These related art approaches extract all paths of a circuit and perform path-based timing on each path. This approach is not always feasible on complex circuits because there are too many paths. Accordingly, in some embodiments, the above-described statistical simulation technique provides accurate timing analysis with feasible processing power and time requirements, as compared to some related art approaches, by interleaving path identification and timing computation.

Analog Circuits

Systems in various application domains involve analog blocks. However, life distribution estimation for analog circuits presents different considerations than estimation for digital circuits. For example, analog circuits may experience unequal stress acceleration, impacting the life estimation due to wearout mechanisms.

Thus, in some embodiments, the impacts of voltage and temperature acceleration on each component of the circuit are taken into account to calculate the circuit-level acceleration factors.

While certain implementations of the disclosed technology have been described throughout the present description and the figures in connection with what is presently considered to be the most practical and various implementations, it is to be understood that the disclosed technology is not to be limited to the disclosed implementations, but on the contrary, is intended to cover various modifications and equivalent arrangements included within the scope of the appended claims and their equivalents. Although specific terms are employed herein, they are used in a generic and descriptive sense only and not for purposes of limitation.

In the foregoing description, numerous specific details are set forth. It is to be understood, however, that implementations of the disclosed technology may be practiced without these specific details. In other instances, well-known methods, structures and techniques have not been shown in detail in order not to obscure an understanding of this description. References to "one implementation," "an implementation," "example implementation," "various implementation," etc., indicate that the implementation(s) of the disclosed technology so described may include a particular feature, structure, or characteristic, but not every implementation necessarily includes the particular feature, structure, or characteristic. Further, repeated use of the phrase "in one implementation" does not necessarily refer to the same implementation, although it may.

Throughout the specification and the claims, the following terms should be construed to take at least the meanings explicitly associated herein, unless the context clearly dictates otherwise. The term "connected" means that one function, feature, structure, or characteristic is directly joined to or in communication with another function, feature, structure, or characteristic. The term "coupled" means that one function, feature, structure, or characteristic is directly or indirectly joined to or in communication with another function, feature, structure, or characteristic. The term "or" is intended to mean an inclusive "or." Further, the terms "a," "an," and "the" are intended to mean one or more unless specified otherwise or clear from the context to be directed to a singular form.

As used herein, unless otherwise specified the use of the ordinal adjectives "first," "second," "third," etc., to describe a common object, merely indicate that different instances of like objects are being referred to, and are not intended to imply that the objects so described must be in a-given sequence, either temporally, spatially, in ranking, or in any other manner.

This written description uses examples to disclose certain implementations of the disclosed technology, including the best mode, and also to enable any person of ordinary skill to practice certain implementations of the disclosed technology, including making and using any devices or systems and performing any incorporated methods. The patentable scope of certain implementations of the disclosed technology is defined in the claims and their equivalents, and may include other examples that occur to those of ordinary skill. Such other examples are intended to be within the scope of the claims and their equivalents.

What is claimed is:

1. A lifetime estimation method comprising:
   extracting, by a processor, features selected from the group consisting of a layout of a circuit, a netlist of the circuit, and the layout and the netlist of the circuit;
   modeling, by the processor, at least one block of the circuit using multivariate adaptive regression splines (MARS) as a fitted function between a response, process parameters, environmental parameters, and timing parameters;
   computing, by the processor, respective lifetime distributions of the extracted features based at least in part:
   on a circuit profile; and
   on the at least one modeled block of the circuit; and
   estimating, by the processor, a lifetime of the circuit by combining the respective lifetime distributions of the extracted features.

2. The method of claim 1, wherein the circuit profile is selected from the group consisting of a thermal profile, an activity profile, a state profile, a voltage source profile, and an ohmic potential drop (IR drop) profile.

3. The method of claim 2 further comprising:
   generating, based on the activity profile, the stress profile, and the thermal profile, respective bias temperature instability (BTI) profiles of the features; and
   generating, based on the activity profile and the stress profile, and the thermal profile, respective hot carrier injection (HCI) profiles of the features;
   wherein computing respective lifetime distributions is further based, at least in part, on the combined effect of the BTI profiles and the HCI profiles.

4. The method of claim 2 further comprising calculating, by the processor using statistical simulation, a time to failure distribution of a memory cell of the circuit based on a profile or parameter selected from the group consisting of the thermal profile, the activity profile, the state profile, the voltage source profile, the IR drop profile, and a process parameter.

5. The method of claim 4, wherein the time to failure distribution of the memory is calculated for discrete values within the thermal profile, the activity profile, the state profile, the voltage source profile, the IR drop profile, and the process parameter.

6. The method of claim 1 further comprising:
   counting, by the processor, a number of the extracted features in the circuit layout; and
   identifying, by the processor, a location of the extracted features;

wherein the estimating is further based, at least in part, on the number and location of the extracted features.

7. The method of claim 1, wherein the circuit comprises memory; and
wherein computing respective lifetime distributions of the extracted features varies, at least in part, as a function selected from the group consisting of cache associatively, cache line size, cache size, and cache replacement algorithm.

8. The method of claim 1, wherein estimating the lifetime of the circuit comprises estimating the effect of error correction on the circuit.

9. The method of claim 1 further comprising:
extracting, by the processor using block-based statistical timing analysis (StTA), critical paths; and
generating, by the processor based on the critical paths, a circuit component-delay distribution;
wherein the estimating is further based, at least in part, on the circuit component-delay distribution.

10. The method of claim 9, wherein estimating the lifetime of the circuit is further based, at least in part, on a timing requirement of the circuit.

11. The method of claim 1, wherein the features are selected from the group consisting of one or more transistors, and one or more dielectric segments.

12. A lifetime estimation method comprising:
extracting, by a processor:
features of cells of a circuit; and
critical paths; modeling, by the processor, the cells using multivariate adaptive regression splines (MARS) as a fitted function between a response, process parameter, and environmental parameters, and timing parameters;
computing, by the processor, respective lifetime distributions of the extracted features based, at least in part;
on the modeled cells; and
a circuit profile selected from the group consisting of a thermal profile, an activity profile, a state profile, a voltage source profile, and an ohmic potential drop (IR drop) profile;
generating, by the processor based at least in part on the critical paths, a circuit component-delay distribution; and
estimating, by the processor, a lifetime of the circuit based at least in part:
by combining the respective lifetime distributions of the extracted features; and
on the circuit component-delay distribution.

13. The method of claim 12 further comprising building, by the processor, a gate-delay model using multivariate adaptive regression splines (MARS) as a fitted function between response variables and process-voltage-temperature (PVT) variations across the circuit;
wherein computing respective lifetime distributions is further based, at least in part, on the gate-delay model.

14. The method of claim 13 further comprising modeling, by the processor, gates and interconnects of the circuit using MARS and a variational Pi-model load;
wherein computing respective lifetime distributions is further based, at least in part, on the gate and interconnect models.

15. The method of claim 13, wherein the gate delay model further uses MARS as a fitted function between response variables and the PVT variations across the circuit manufacturing process.

16. The method of claim 12, wherein feature extraction creates feature count and location data; and
wherein the estimating is further based, at least in part, on the feature count and location data.

17. The method of claim 12, wherein extracting critical paths uses block-based statistical timing analysis (StTA).

18. The method of claim 12, wherein estimating the lifetime of the circuit is further based, at least in part, on a timing requirement of the circuit.

19. A lifetime estimation method comprising:
extracting, by a processor, features of a circuit vulnerable to front-end wearout mechanisms;
building, by the processor, a gate-delay model using multivariate adaptive regression splines (MARS) as a fitted function between response variables and process-voltage-temperature (PVT) variations across the circuit;
computing, by the processor, respective lifetime distributions of the extracted features based, at least in part on:
on a circuit profile; and
the gate-delay model; and
estimating, by the processor, a lifetime of the circuit by combining the respective lifetime distributions of the extracted features.

20. The method of claim 19, wherein the respective lifetime distributions are further based, at least in part, on the effect of one or more of the front-end wearout mechanisms.

21. The method of claim 19, wherein at least one front-end wearout mechanism is selected from the group consisting of gate oxide breakdown and middle-of-line time-dependent dielectric breakdown.

* * * * *